US006656271B2

(12) United States Patent
Yonehara et al.

(10) Patent No.: US 6,656,271 B2
(45) Date of Patent: *Dec. 2, 2003

(54) METHOD OF MANUFACTURING SEMICONDUCTOR WAFER METHOD OF USING AND UTILIZING THE SAME

(75) Inventors: Takao Yonehara, Atsugi (JP); Kunio Watanabe, Kawasaki (JP); Tetsuya Shimada, Zama (JP); Kazuaki Ohmi, Yokohama (JP); Kiyofumi Sakaguchi, Yokohama (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/453,539

(22) Filed: Dec. 3, 1999

(65) Prior Publication Data

US 2003/0159644 A1 Aug. 28, 2003

(30) Foreign Application Priority Data

Dec. 4, 1998 (JP) ............................................ 10-346116
Mar. 26, 1999 (JP) ............................................ 11-084649
Nov. 25, 1999 (JP) ............................................ 11-334544

(51) Int. Cl.⁷ ............................................... C30B 25/18
(52) U.S. Cl. ........................... 117/94; 117/84; 117/95; 117/913
(58) Field of Search ..................... 117/94, 95, 913, 117/84

(56) References Cited

U.S. PATENT DOCUMENTS

| 4,445,965 | A | * | 5/1984 | Milnes ........................ 117/915 |
| 4,837,182 | A | * | 6/1989 | Bozler et al. ................ 117/915 |
| 5,073,230 | A | * | 12/1991 | Maracas et al. ............ 117/915 |
| 5,131,979 | A |   | 7/1992 | Lawrence .................... 156/655 |
| 5,362,683 | A | * | 11/1994 | Takenaka et al. ............ 117/915 |
| 5,371,037 | A |   | 12/1994 | Yonehara ..................... 437/86 |
| 5,374,564 | A |   | 12/1994 | Bruel .......................... 437/24 |

(List continued on next page.)

FOREIGN PATENT DOCUMENTS

| EP | 0 533 551 | 3/1993 |
| EP | 0 553 859 | 8/1993 |
| EP | 0 767 486 | 4/1997 |
| EP | 0 774 776 | 5/1997 |
| EP | 0 793 263 | 9/1997 |
| EP | 0 843 344 | 5/1998 |
| EP | 0 843 346 | 5/1998 |

(List continued on next page.)

OTHER PUBLICATIONS

T. Unagami, "Formation Mechanism of Porous Silicon Layer by Anodization in HF Solution", *J. Electrochem. Soc.: Solid–State Science and Technology*, vol. 127, No. 2, (Feb. 1980), pp. 476–483.

*Primary Examiner*—Robert Kunemund
(74) *Attorney, Agent, or Firm*—Fitzpatrick, Cella, Harper & Scinto

(57) ABSTRACT

A process for manufacturing a semiconductor wafer which has superior suitability for mass production and reproducibility. The process comprises the steps of preparing a first member which has a monocrystalline semiconductor layer on a semiconductor substrate with a separation layer arranged therebetween with a semiconductor wafer as the raw material, transferring the monocrystalline semiconductor layer onto a second member which comprises a semiconductor wafer after separating the monocrystalline semiconductor layer through the separation layer, and smoothing the surface of the semiconductor substrate after the transferring step so as to be used as a semiconductor wafer for purposes other than forming the first and second members.

37 Claims, 17 Drawing Sheets

U.S. PATENT DOCUMENTS

| | | | |
|---|---|---|---|
| 5,391,257 A | * | 2/1995 | Sullivan et al. ............. 117/915 |
| 5,710,057 A | * | 1/1998 | Kenney ...................... 117/915 |
| 5,811,348 A | | 9/1998 | Matsushita et al. ......... 438/455 |
| 5,856,229 A | | 1/1999 | Sakaguchi et al. .......... 438/406 |
| 5,919,305 A | * | 7/1999 | Solomon ..................... 117/915 |
| 5,953,622 A | | 9/1999 | Lee et al. .................... 438/458 |

FOREIGN PATENT DOCUMENTS

| | | |
|---|---|---|
| EP | 0 849 788 | 6/1998 |
| EP | 0 851 513 | 7/1998 |
| EP | 0 854 662 A | 7/1998 |
| EP | 0 867 922 | 9/1998 |
| JP | 5-211128 | 8/1993 |
| JP | 7-302889 | 11/1995 |
| JP | 8-213645 | 8/1996 |
| JP | 2608351 | 2/1997 |
| JP | 10-200080 | 7/1998 |
| JP | 10-233352 | 9/1998 |
| JP | 10-270361 | 10/1998 |
| KR | 1998-038049 | 8/1998 |
| WO | 98/52216 | 11/1998 |

* cited by examiner

METHOD OF MANUFACTURING SEMICONDUCTOR WAFER METHOD OF USING AND UTILIZING THE SAME

BACKGROUND OF THE INVENTION

1. Field of the Invention

This invention relates to a process for manufacturing a semiconductor wafer and also to a process for using and utilizing such a semiconductor wafer.

More particularly, the present invention relates to a process for manufacturing a semiconductor wafer that can be used for producing a semiconductor device such as a microprocessor, a memory, a logic circuit, a system LSI, a solar battery, an image sensor, a light emitting device or a display device, as a monitor wafer such as a film thickness monitor to be used for forming a film, an etching depth monitor to be used for an etching operation or a particle monitor to be used for detecting and counting foreign particles or as a dummy wafer to be used in a processing system in order to regulate various processing conditions for film formation, heat treatment, doping or etching. It also relates to a method of using and utilizing such a semiconductor wafer. Specifically, the present invention is adapted to manufacture semiconductor wafers of different types that can be used and utilized in different applications.

2. Related Background Art

Semiconductor wafers having layers of various semiconductor materials such as Si, GaAs, InP and GaN are known. Particularly, SOI wafers comprising a support substrate having an insulating surface and a semiconductor layer formed thereon are attracting attention as they are highly adapted to preparing semiconductor devices that operate at high speed with a low power consumption. For the purpose of this invention, an SOI wafer refers to a wafer carrying a semiconductor on an insulator, which may not necessarily be a wafer carrying silicon on an insulator.

Known SOI wafers include SIMOX wafers prepared through oxygen ion implantation and heat treatment and bonded wafers such as those described in Japanese Patent Application Laid-Open No. 5-211128, U.S. Pat. No. 5,374,564 and Japanese Patent Application Laid-Open No. 10-200080 and prepared through hydrogen ion implantation and peeling as well as the one described in International Patent Publication WO98/52216 and prepared through plasma immersion ion implantation (PIII). Japanese Patent Application Laid-Open No. 2608351 and U.S. Pat. No. 5,371,037 describe respective methods of preparing a high quality SOI wafer by transferring an epitaxial layer on a separate support substrate.

Japanese Patent Application Laid-Open No. 7-302889 (U.S. Pat. No. 5,856,229) proposes an improved method for transferring an epitaxial layer.

FIGS. 17A through 17E schematically illustrate the known method for transferring an epitaxial layer.

Firstly, as shown in FIG. 17A, a semiconductor wafer that is an Si wafer (which may be referred to as prime wafer, bond wafer, device wafer or seed wafer) is brought in and the surface anodized to produce a porous layer 4 on the surface.

Then, as shown in FIG. 17B, a non-porous monocrystalline semiconductor layer 5 is formed on the porous layer 4 by epitaxial growth, typically using a CVD technique.

Thereafter, as shown in FIG. 17C, the surface of the epitaxial layer (non-porous monocrystalline semiconductor layer) is oxidized to produce an insulating layer 6. Then, said insulating layer 6 is brought to contact with and bonded to the surface of another semiconductor wafer 2 (or a piece of quartz glass). Thus, a multilayer structure containing the epitaxial layer 5 in the inside is prepared.

Then, as shown in FIG. 17D, the multilayer structure is subjected to external force or internal stress typically by inserting a wedge into a lateral side thereof or heating the multilayer structure in order to split it along the porous layer (reference numerals 41 and 42 in FIG. 17D shows the split porous layer).

Then, the porous layer 4B remaining on the surface of the epitaxial layer 5 that has been transferred to the second semiconductor wafer 2 (also referred to as handle wafer or base wafer) is removed by wet etching, using a mixture solution of hydrofluoric acid and hydrogen peroxide. Then, as shown in FIG. 17E, the exposed epitaxial layer is smoothed typically by hydrogen annealing to produce a finished SOI that has remarkable characteristics.

On the other hand, the separated Si wafer still maintains the profile of a thin disk. Therefore, it can be used as Si wafer 1 for preparing another SOI wafer as shown in FIG. 17A for another time after removing the porous layer remaining on the cleaved side thereof also by wet etching, using the same solution. Alternatively, it may be used as semiconductor wafer 2 for preparing another SOI wafer as shown in FIG. 17B.

As described above, Japanese Patent Application Laid-Open No. 7-302889 discloses a method of reusing a peeled Si wafer as Si wafer 1 as shown in FIG. 17A or as semiconductor wafer 2 as shown in FIG. 17B.

However, the above described method is accompanied by several problems to be dissolved.

For instance, when an Si wafer is repeatedly reused as the first wafer, it gradually loses its thickness because its surface layer is turned into a porous layer for another time and the produced porous layer is subsequently removed. Therefore, each reuse of such an Si wafer may require a cumbersome process of adjusting the conditions under which it is reused by forming a porous layer on the surface to consequently reduce its thickness further. Additionally, if a multilayer structure is produced, it can be sensitively affected by the thickness of the first wafer and those of other layers to become swerved under certain conditions. Thus, it is highly important to rigorously control the thickness of the first wafer.

Additionally, the damage to the Si wafer that occurred in the separating step may adversely affect the subsequent steps including that of producing a porous layer to make it no longer usable for manufacturing SOI wafers having the same and identical characteristics.

Still additionally, the process of manufacturing SOI wafers is far more complex than that of manufacturing bulk wafers and hence the yield of manufacturing SOI wafers is normally rather low. In other words, if the reusable first wafer is actually reused as the first or second wafer for preparing another SOI wafer, it may not satisfactorily be used on a commercial basis from the viewpoint of attaining a necessary quality level.

While the above known method of reusing an Si wafer is intended to reuse the first wafer that is recovered after the process of manufacturing an SOI wafer for manufacturing another SOI wafer of the same quality, the Si wafer is normally short of meeting the requirements of a commercially feasible wafer of the type under consideration.

Then, such an Si wafer may have no value from the viewpoint of reducing waste and exploiting limited resources in the industry of the near future.

SUMMARY OF THE INVENTION

An object of the present invention is to provide a process for manufacturing a semiconductor wafer which has superior suitability for mass production and reproducibility.

It is another object of the present invention to provide a process for manufacturing a semiconductor wafer which improves economic efficiency and provides SOI wafers having excellent quality without decreasing the number of wafers on the market.

A process for manufacturing a semiconductor wafer according to the present invention comprises the steps of:

preparing a first member which has a semiconductor layer on a semiconductor substrate;

transferring said semiconductor layer onto a second member after separating said semiconductor layer from said first member; and smoothing the surface of said semiconductor substrate after said transferring step so as to use said semiconductor substrate as a semiconductor wafer for purposes other than forming said first and second members.

Moreover, a process for manufacturing a semiconductor wafer according to the present invention comprises the steps of:

preparing a first member which has a semiconductor layer on a semiconductor substrate with a separation layer arranged therebetween;

transferring said semiconductor layer onto a second member after separating said semiconductor layer through said separation layer; and smoothing the surface of said semiconductor substrate after said transferring step so as to use said semiconductor substrate as a semiconductor wafer for purposes other than forming said first and second members.

A process for manufacturing a semiconductor wafer according to the present invention comprises the steps of:

preparing a first member which has a semiconductor layer on a p-type semiconductor substrate;

separating said semiconductor layer from said first member to transfer the semiconductor layer onto a second member, thereby forming a first semiconductor wafer; and conducting epitaxial growth of a low concentration p-type semiconductor layer on said p-type semiconductor substrate from which said semiconductor layer has been separated, said low concentration p-type semiconductor layer having an impurity concentration, which defines p-type conductivity, lower than that of said p-type semiconductor substrate.

A process for manufacturing a semiconductor wafer according to the present invention comprises the steps of:

preparing a first member which has a semiconductor layer on a p-type semiconductor substrate with a separation layer arranged therebetween;

separating said semiconductor layer through said separation layer to transfer the semiconductor layer onto a second member, thereby forming a first semiconductor wafer; and conducting epitaxial growth of a low concentration p-type semiconductor layer on said p-type semiconductor substrate which has been separated through said separation layer, said low concentration p-type semiconductor layer having impurity concentration, which defines p-type conductivity, lower than that of said p-type semiconductor substrate.

A process for manufacturing a semiconductor wafer according to the present invention comprises the steps of:

forming a separation layer within a p-type semiconductor substrate to form a first member which has a semiconductor layer on said separation layer;

separating said semiconductor layer through said separation layer to transfer the semiconductor layer onto a second member, thereby forming a first semiconductor wafer; and conducting epitaxial growth of a low concentration p-type semiconductor layer on said p-type semiconductor substrate which has been separated through said separation layer, said low concentration p-type semiconductor layer having impurity concentration, which defines p-type conductivity, lower than that of said p-type semiconductor substrate.

A process for manufacturing a semiconductor wafer according to the present invention comprises steps of:

preparing a first member which has a semiconductor layer on a p-type semiconductor substrate with a separation layer arranged therebetween;

bonding said first member with a second member to form a multilayer structure;

conducting heat-treatment of said multilayer structure under an oxidizing atmosphere separating said multilayer structure through said separation layer to transfer said semiconductor layer onto a second member, thereby forming a first semiconductor wafer; and conducting epitaxial growth of a low concentration p-type semiconductor layer on said p-type semiconductor substrate which has been separated through said separation layer, said low concentration p-type semiconductor layer having impurity concentration, which defines p-type conductivity, lower than that of said p-type semiconductor substrate.

A process for manufacturing a semiconductor wafer according to the present invention comprises the steps of:

preparing a first member which has at least a first semiconductor layer comprising an epitaxial semiconductor layer having impurity concentration, which defines p-type conductivity, lower than that of a p-type semiconductor substrate, a separation layer, and a second semiconductor layer, arranged on said p-type semiconductor substrate in that order; and forming a first semiconductor wafer by transferring said second semiconductor layer onto said second member through the separation step of separating said second semiconductor layer through said separation layer, and forming a second semiconductor wafer by separating said p-type semiconductor substrate having said first semiconductor layer through said separation layer.

A process for manufacturing a semiconductor wafer according to the present invention comprises the steps of:

forming at least a first semiconductor layer comprising an-epitaxial semiconductor layer having impurity concentration, which defines p-type conductivity, lower than that of a p-type semiconductor substrate; and a second semiconductor layer comprising an epitaxial semiconductor layer having impurity concentration, which defines p-type conductivity, higher than that of said first semiconductor layer; arranged on said p-type semiconductor substrate in the order as mentioned; making said second semiconductor layer and part of said first semiconductor layer porous; and forming a third semiconductor layer onto said second semiconductor layer made porous; thereby forming a first member; and transferring said third semiconductor layer onto said second member to form a first semiconductor wafer, and forming a second semiconductor wafer comprising said p-type semiconductor substrate having said first semiconductor layer.

A method for using a semiconductor wafer according to present invention is characterized by preparing a seed-wafer which has been used for manufacturing a bonded SOI substrate followed by conducting smoothing treatment on at least one surface of said seed-wafer so as to be sold as a semiconductor wafer without being used for manufacturing the bonded SOI substrate again.

DESCRIPTION OF THE PREFERRED EMBODIMENTS

Figure 1:
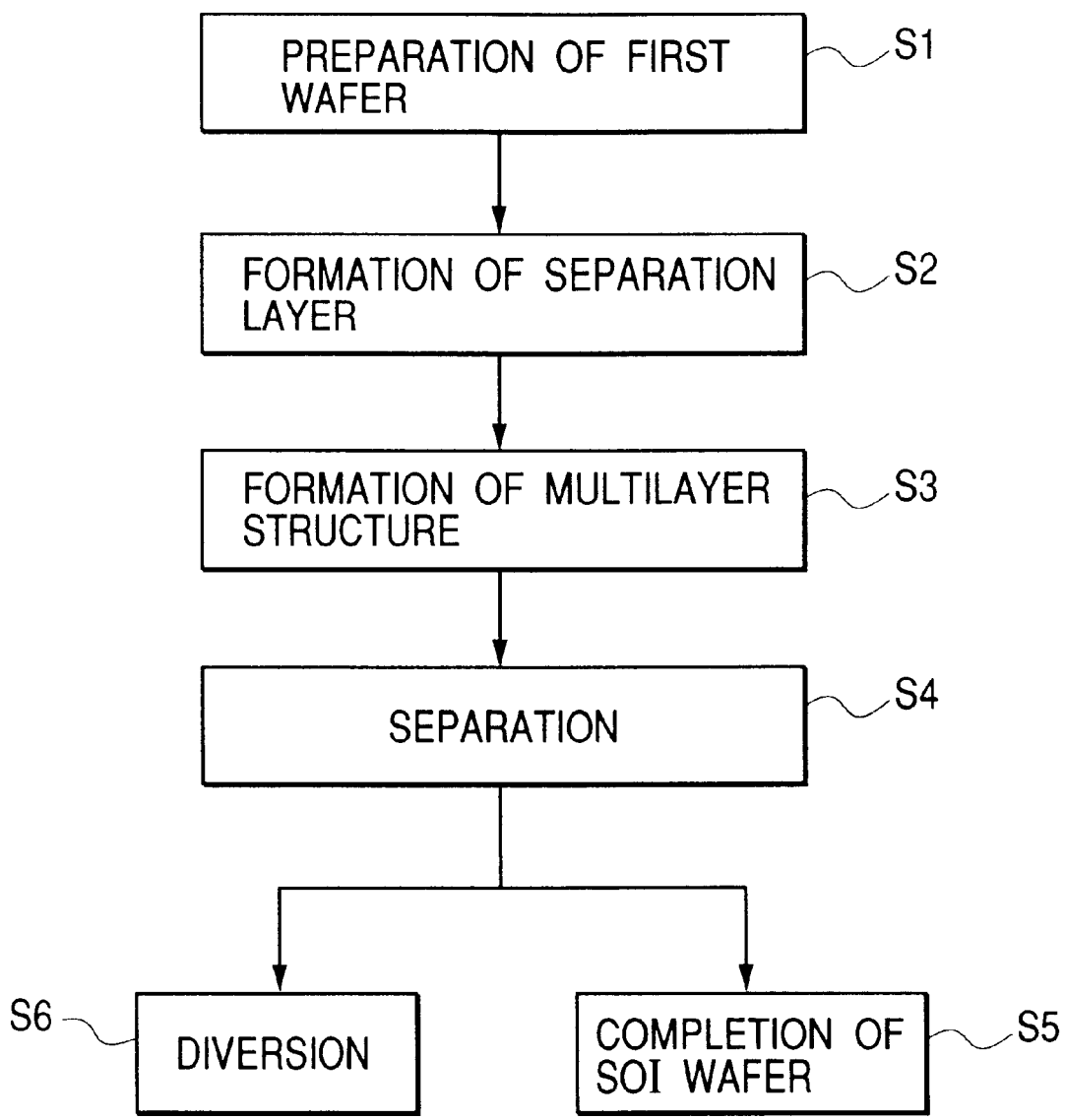
FIG. 1 is a flow chart showing a process for manufacturing a semiconductor wafer according to a fundamental embodiment of the present invention.

FIG. 1 is a flow chart showing a process for manufacturing a semiconductor wafer according to a m fundamental embodiment of the present invention.

First, as shown in step S1 of FIG. 1, a semiconductor wafer is provided as a first wafer. As a semiconductor wafer, both an SOI wafer and a non-SOI wafer can be employed. In particular, non-SOI wafers such as a CZ wafer, an FZ wafer, an epitaxial wafer, and a hydrogen-annealed wafer are preferably employed. The CZ wafer and FZ wafer are wafers produced by the Czochralski process and floating zone process, respectively.

Next, as in step S2, a separation layer is formed on the semiconductor wafer, and a first member having a monocrystalline semiconductor on a semiconductor substrate with a separation layer arranged therebetween is formed. There are two methods for forming the separation layer. One is a method for forming a porous layer, and then, forming a non-porous layer on its surface. The non-porous layer is formed by a method of epitaxially growing it on the porous layer, and a method of conducting heat-treatment on the surface of the porous layer in a reducing atmosphere containing hydrogen or the like. The other is a method of injecting at least one ion of a hydrogen ion, a rare gas ion, and a nitrogen ion or the like into the first wafer, thereby forming a layer including fine voids (these fine voids include gas or the like called micro-bubbles, which are also called micro-cavity) or a layer including potential fine voids that can be produced by subsequent heat treatment at a predetermined depth position from the surface of the first water.

In any case, a monocrystalline semiconductor layer having its predetermined thickness on the surface of a semiconductor wafer is formed before forming the separation layer, and the separation layer may be formed within the layer.

A layer on the semiconductor layer is selected from among a monocrystalline semiconductor layer, polycrystalline semiconductor layer, and an amorphous semiconductor layer or the like. Specifically, it includes Si, Ge, SiGe, SiC, C, GaAs, AlGaAs, InGaAs, InP, InAs or the like. Further, on the surface of these semiconductor layers, an insulating layer such as silicon oxide, silicon nitride, or silicon nitride oxide or the like may be formed by thermal oxidization, CVD, sputtering or the like.

If a separation layer is not formed in advance, as described later, a multilayer structure may be cut at a proper position after the structure has been formed. Alternatively, if an interface at which stress is produced is prepared, the structure will be separated at the interface. That is, the structure may be via the steps of S1, S3, and S4.

Then, in step S3, a portion being a support substrate (a second member) is formed on a semiconductor wafer having a separation layer formed thereon, and a multilayer structure is formed. There are two methods for forming a portion being this support substrate. One is a method of bonding an additionally provided second wafer on the first wafer having the separation layer formed thereon; and the other is a method of depositing a relatively thick material such as polycrystalline silicon on the first wafer, thereby forming a support substrate. As a second wafer, a wafer having the same structure as the first semiconductor substrate such as a CZ wafer, an FZ wafer, an epitaxial wafer, a hydrogen annealed wafer or the like can be employed. The first wafer may be bonded directly on the semiconductor surface of these wafers or may be bonded via an insulating layer and/or a bonding layer between these wafers. Alternatively, in place of the second wafer, an insulating transparent substrate such as quartz glass, plastics or the like, a conductive metal substrate such as flexible metal film, aluminum, stainless steel or the like, or ceramics or the like can be employed, and the first wafer may be bonded directly or indirectly thereto via the insulating layer and/or the bonding layer.

Then, in step S4, a multilayer structure is separated on the separation layer. There are two separation methods. One is a method of externally heating a multilayer structure, emitting light to the multilayer structure to absorb light, thereby generating separation energy inside of the multilayer structure. Specifically, a layer including fine voids formed by implanting a hydrogen ion, a rare gas ion, a nitride ion or the like at a predetermined depth position of the first wafer or a layer including potential fine voids is subjected to thermal energy, whereby its density decreases with increasing the fine voids. In this manner, a release phenomenon of a multilayer structure occurs in the layer. This is a method of generating separation energy inside the multilayer structure. Alternatively, there may be a separation method of oxidizing the separation layer and/or its vicinity from the side by heating process and utilizing stress due to growth of oxide film or the like. The above heat energy is generated by heat treatment at 300° C. to 800° C. or preferably heat treatment at 400° C. to 600° C.

The other is a method of externally imparting separation energy directly to a multilayer structure. Specifically, it includes a method of inserting a wedge into the side of the multilayer structure, thereby peeling the structure; a method of blowing a fluid consisting of liquid and/or gas on the side of the multilayer structure, thereby peeling the structure; a method of applying tensile force in opposite directions to the front and back surfaces of the multilayer structure with each other, thereby peeling the structure; a method of applying a pressing force in opposite directions to the front and back surfaces of the multilayer structure with each other, thereby destroying to peel a separation layer; a method of applying shear force to the side of the multilayer structure, thereby destroying the separation to peel the structure; a slicing method using an inner circumference blade or a wire saw; or a method of imparting ultrasonic wave vibration, thereby destroying the separation layer and the like.

As for a fluid to be used, there can be used an organic solvent such as alcohol without using water; acid such as hydrofluoric acid and nitric acid; or alkali such as potassium hydroxide; and liquid having function of selectively etching the other separation area or the like. Further, as a fluid, gas such as air, nitrogen gas, carbonic acid gas, rare gas or the like may be employed. Gas or plasma capable of etching action to the separation area can be employed. For use as jet flow, it is desirable to use water with its high purity such as pure water or ultra-pure water having impurity metal or particles removed therefrom. However, when the separation step is carried out in a completely low-temperature process, it is possible to perform rinsing and removal after water jet separation.

Of course, the above mentioned various separation methods may be used in combination.

The thus obtained wafer becomes a highly value-added wafer such as an SOI wafer, and a semiconductor device is produced using the wafer. The produced semiconductor device has its superiority in low power consumption, and can be operated at high speed (step S5).

On the other hand, the separated first wafer (semiconductor substrate) is employed as a non-SOI wafer with its surface being smoothed (smoothened) instead of being utilized as a first or second wafer again in the above step, and a general semiconductor device is provided by utilizing the wafer. Alternatively, this wafer can be used as a monitoring or dummy wafer (step S6). In addition, the wafer can be diverted for producing solar cells through a process disclosed in Japanese Patent Application Laid-Open Nos. 8-213645, 10-233352, and 10-270361.

For surface smoothing, at least one out of polishing, grinding, etching, heat treatment or the like may be applied to the separated first wafer. In particular, a method of conducting heat treatment on the first wafer separated in a reducing atmosphere containing hydrogen (hydrogen annealing) is a more preferred method in that surface smoothing is made possible while a decrease in wafer thickness is suppressed, and at the same time, impurities such as boron contained in the wafer surface layer after separation are diffused outwardly, making it possible to lower the concentration of impurities.

A temperature preferable for hydrogen annealing is above 300° C. and below the melting point of a wafer-consisting material. When this annealing is applied to a monocrystalline silicon wafer, the lower limit of the temperature is 800° C., more preferably 1000° C., and the upper limit of the temperature is the melting point of the silicon, more preferably 1400° C., or further preferably 1200° C.

The pressure of a reducing atmosphere preferable to hydrogen annealing may be increased pressure, atmospheric pressure, or reduced pressure, it should be below the atmospheric pressure and $3.9 \times 10^4$ Pa or above, or it should be preferably below the atmospheric pressure and 1.3 Pa or more.

The treatment time preferable to hydrogen annealing is not particularly limited, because it is selected appropriately according to required properties. The realistic range is from about 1 minute to 10 hours.

As a gas for providing a reducing atmosphere containing hydrogen, 100% hydrogen and a mixture gas of hydrogen and inert gas can be employed.

A first wafer after peeling, which was obtained via such hydrogen annealing, is at the same level as that of a commercially available hydrogen-annealed wafer, which is preferable to produce a semiconductor device such as LSI.

Smoothing due to polishing is a very superior method. Even if a surface failure occurs, the faulty surface can be almost removed by polishing it. Unlike surface polishing of the SOI layer, severe requirements are not applied to this polishing with respect to its uniformity. The polishing can be performed by a method similar to polishing of a general Si wafer, and is superior in mass productivity. However, the wafer thickness is decreased by polishing, and thus, hydrogen annealing is superior in this point of view.

As a polishing method, chemical and mechanical polishing (CMP) is preferred. As a polishing agent for performing CMP, there can be employed silica glass (borosilicate glass), titanium dioxide, titanium nitride, aluminum oxide, iron nitrate, cerium oxide, colloidal silica, silicon nitride, silicon carbide, graphite, polishing granule such as diamond, or a granule liquid having these granules and oxidizing agent such as $H_2O_2$ or $KIO_3$ or alkali solution such as NaOH, KOH or the like mixed therewith.

Smoothing or smoothening steps can be omitted. Of course, in the case of polishing, mirror face polishing may be carried out or not only one side but also both sides may be mirror-face polished.

Figure 2:
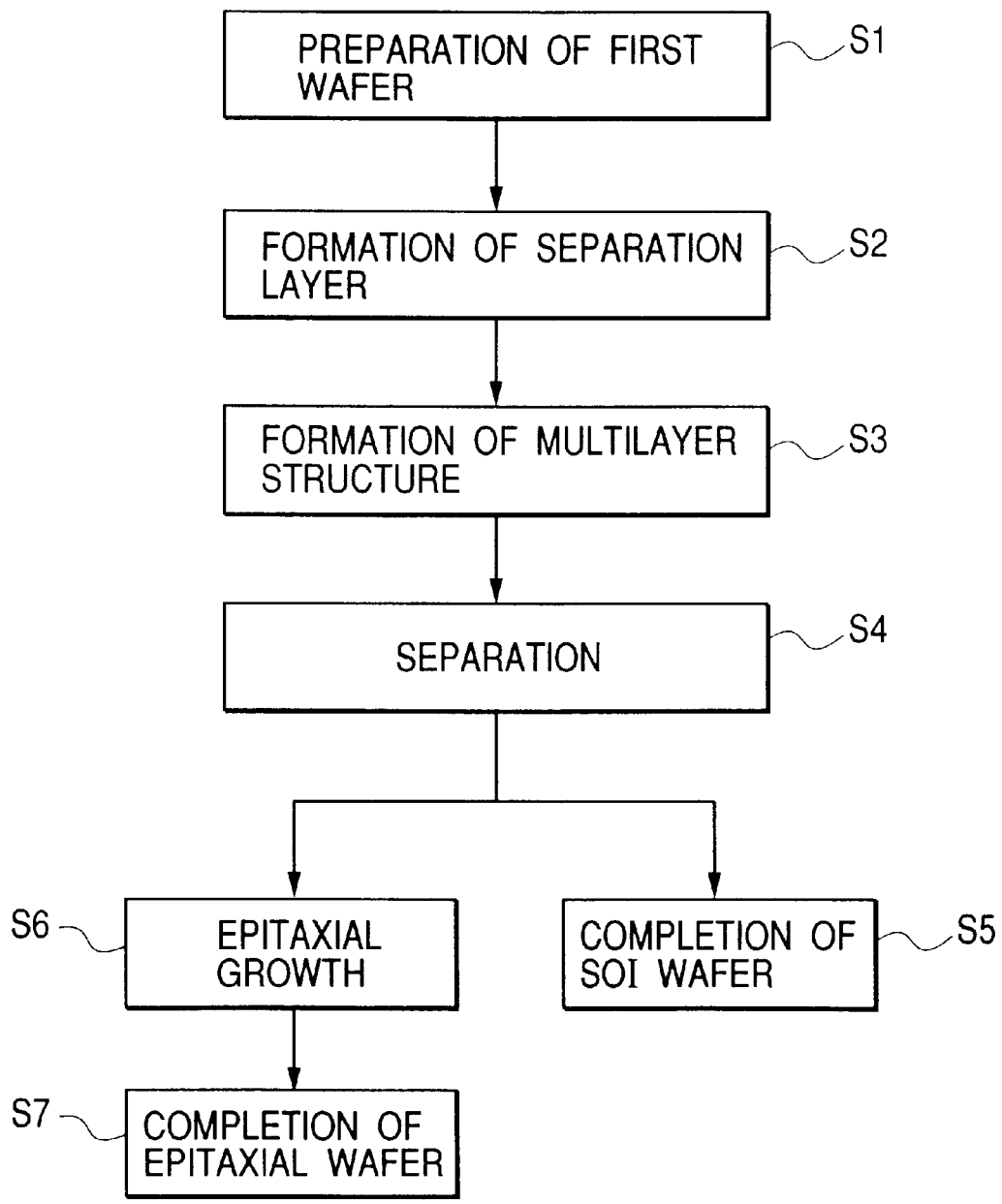
FIG. 2 is a flow chart showing a process for manufacturing a semiconductor wafer according to another fundamental embodiment of the present invention.

In the present invention, when a P-type semiconductor wafer is employed as a first wafer in particular, as shown in FIG. 2, a first semiconductor wafer such as an SOI wafer is prepared (step S5) in separation step S4; the separated P-type semiconductor wafer is smoothed, a P⁻ layer or an N layer and the like is epitaxially grown (step S6) on its surface; and then an epitaxial wafer having a P⁻ layer or an N layer and the like formed on a P-type semiconductor wafer can be prepared (step S7). In particular, as a P-type semiconductor wafer, a high concentration P-type semiconductor wafer is preferably employed. This is because, as described later, in particular, the form of P⁻ epitaxial/P⁺ substrate is the most widely employed among the currently employed wafer. Epitaxial growth treatment may be applied after the surface of the first wafer after peeling has been once smoothened. This epitaxial growth treatment can be applied after only rinsing after peeling without applying polishing, etching, or heat treatment.

Figure 3:
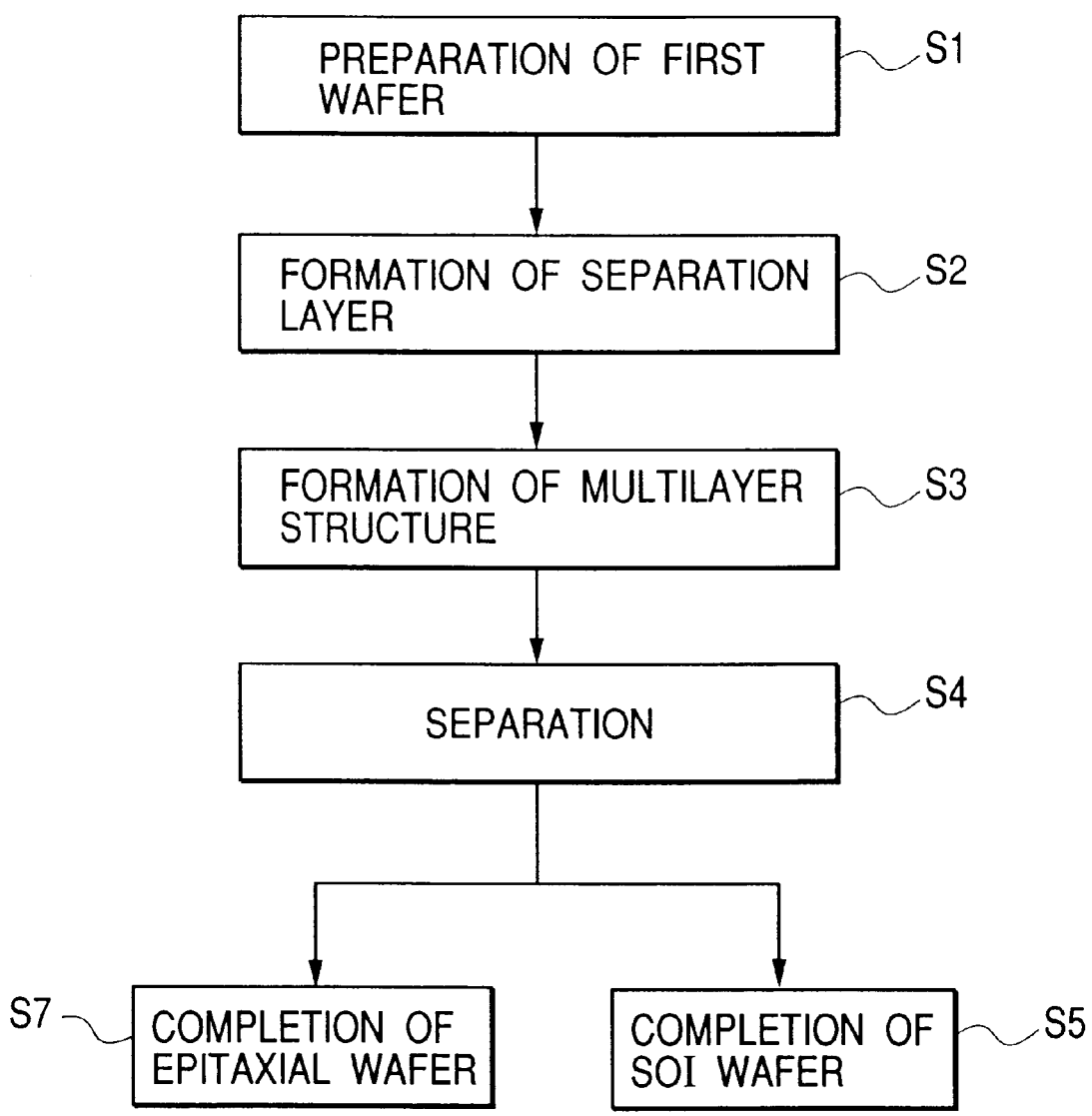
FIG. 3 is a flow chart showing a process for manufacturing a semiconductor wafer according to another fundamental embodiment of the present invention.

When an epitaxial semiconductor layer is formed on a high condensed P-type semiconductor wafer as a first wafer, and is employed, as shown in FIG. 3, a first semiconductor wafer such as an SOI wafer is prepared (step S5) in separation step S4. In addition, an epitaxial semiconductor layer remains on the separated high concentration P-type semiconductor wafer depending on a separation position. Thus, an epitaxial wafer can be prepared without newly causing epitaxial growth (step S7). For example, an epitaxial wafer having P⁻ epitaxial layer is completed on the P⁺ substrate. That is, an epitaxial semiconductor layer is formed in step S1, on which a separation layer is formed. Thus, unlike FIG. 2, there is no need for providing a new epitaxial semiconductor layer in step S6. In particular, a P⁻ (or N-) type first semiconductor layer is formed on the high concentration P-type semiconductor wafer, on which a second semiconductor layer is further formed, and the separation position is preferably provided inside of the first semiconductor layer. The high concentration P type has a boron concentration of $1 \times 10^{17}$ cm⁻³ to $1 \times 10^{20}$ cm⁻³ and a specific resistance of 0.001 to 0.5 ohm·cm resistance.

Making it porous for forming a separation layer is conditionally possible on a N-type semiconductor, and however, it is desirable to employ a P-type semiconductor. Unagami et al. studied Si solution reaction in anodization, and concluded that positive pores were required in anodization in HF solution (T Unagami, J. Electrochem. Soc., vol. 127, 476 (1980)). To make it porous, a high concentration P-type semiconductor wafer is preferably employed, and its impurities concentration range is generally from $5.0 \times 10^{16}$/cm³ to $5.0 \times 10^{20}$/cm³, preferably $1.0 \times 10^{17}$/cm³ to $2.0 \times 10^{20}$/cm³, and more preferably, $5.0 \times 10^{17}$/cm³ to $1.0 \times 10^{20}$cm³. When a separation layer is formed by ion plantation, hydrogen, nitrogen, rare gas or the like (He, Ne, Ar or the like) is employed as an ion implantation species. At least one or more of them may be implanted.

A temperature preferable to epitaxial growth is 500° C. or above and below the melting point of a wafer-consisting material. When epitaxial growth is applied to a monocrystalline silicon wafer, the lower limit of temperature is 600° C., more preferably 800° C., and the upper limit of the temperature is the melting point of the silicon, more preferably 1400° C., and further preferably 1200° C.

Epitaxial growth is carried out by CVD method or sputtering method, the preferable atmospheric pressure may be atmospheric pressure or reduced pressure, should be below atmospheric pressure and $3.9 \times 10^{-4}$ Pa or more, or should be more preferably below atmospheric pressure and 1.3 Pa or above.

The treatment time preferable to epitaxial growth is not limited in particular, because it is selected according to a required film thickness. The realistic range is from 10 seconds to 10 hours.

As an atmospheric raw material gas for epitaxial growth, there is exemplified at least one gas selected from among silane or its analogous such as $SIH_4$, $SiCl_3H$, $SiCl_2H_2$, $SiCl_4$, $Si_2H_6$, $SiF_4$ or the like. For the purpose of addition of impurities, acceptor-containing gas such as $B_2H_6$, $BF_3$, $BBr_3$ or donor-containing gas such as $PH_3$, $AsH_3$ or the like may be added thereto. Further, hydrochloric acid, chlorine or the like may be added to the above or hydrogen or rare gas may be added. In general, hydrogen gas is employed as a carrier gas.

As described above, in one embodiment of the present invention, an SOI wafer is fabricated using a Pa wafer preferable to make it porous as a first wafer, and an epitaxial layer is grown on the surface of the first wafer after peeling, and the epitaxial wafer is produced. The produced epitaxial wafer is preferable to produce integrated circuits such as memory, logic circuit, analog signal processing circuit, and analog-digital hybrid circuit or semiconductor functional elements such as CCD, solar cells or the like. In a single manufacturing process, both of the SOI wafer and epitaxial wafer can be manufactured, and comprehensive material cost can be reduced.

Hereinafter, an epitaxial wafer will be described.

In low power consumption and high-speed LSI technology (Realize Co., Ltd., P. 479 to P. 483), as one of the substrate structures for reducing a digital noise, a P⁻ epitaxial layer/P⁺ substrate is exemplified.

According to Section 5-1, Silicon Science (UCS Semiconductor Substrate Technical Study Society, Realize Co., Ltd.), when a MOS LSI is manufactured on an epitaxial wafer, most of the MOS LSI is employed in the P-type epitaxial/P* substrate structure. Thus, the most important factor for which the epitaxial wafer is employed is that a software error and a latch-up can be improved. In addition, in Section 5.4, the epitaxial wafer of the P-type epitaxial/P⁺ substrate has its TDDB characteristics better than the CZ bulk Si wafer in insulation breakage characteristics of the MOS-structured oxide film, and there is a strong getting effect due to the region high in boron concentration in the substrate.

In this section, the price of an epitaxial wafer is discussed. If the aperture of the wafer becomes large, the difference in price between the epitaxial wafer and the CZSi wafer becomes small. For a gigabit age, an ultra-high quality Si crystal is required. Further, there comes an age in which a large amount of epitaxial wafers are used for highly integrated MOS LSI such as DRAM due to an increase in price ratio (against epitaxial wafer price) of the CZ crystal which has a larger diameter.

In the present invention, when a porous layer is formed as a separation layer, a high concentration P⁺ wafer is desirably employed. When the separated high concentration p⁺ wafer (semiconductor substrate) is utilized or diverted as a P⁻-epitaxial substrate without discarding it, one high-quality SOI wafer and one epitaxial wafer can be manufactured from these two wafers. In addition, as a wafer for manufacturing an SOI wafer, a new wafer can be always employed, and thus, the SOI wafer manufacturing efficiency can be increased. Therefore, a commercially advantageous semiconductor production system can be constructed for mass-consumption of the above mentioned epitaxial wafer.

When P⁻ wafer is employed as a first wafer, a wafer preferable to produce the above mentioned integrated circuit or semiconductor functional element is formed merely by smoothing the surface without applying epitaxial growth treatment. Of course, when a higher quality layer is required for producing such integrated circuit or semiconductor functional element, an epitaxial layer may be further formed on the smoothed surface. When the separated first wafer (semiconductor substrate) is utilized or diverted, the price of this wafer is almost equal to or more inexpensive than the initial wafer. Further, if the wafer is highly value-added, it can be sold at a higher price, and thus, a commercially advantageous semiconductor production system can be constructed.

Hereinafter, preferred embodiments of the present invention will be described in more detail with reference to the accompanying drawings.

Embodiment 1

FIGS. 4A to 4G are schematic views showing a wafer manufacturing process according to a First Embodiment of the present invention.

Figure 4A:
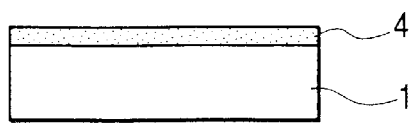
FIGS. 4A, 4B, 4C, 4D, 4E, 4F and 4G are process diagrams showing a process for manufacturing a wafer according to a first embodiment of the present invention.

First, as shown in FIG. 4A, the surface of a first wafer 1 consisting of a bulk wafer such as a CZ silicon wafer, an FZ silicon wafer or the like is subjected to a nodization to make it porous, and a porous layer 4 is formed.

Figure 4B:
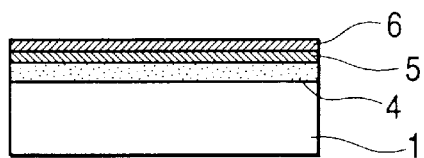

Then, as shown in FIG. 4B, a non-porous layer 5 is formed on the porous layer 4 to form a first member. A method for forming the non-porous layer 5 includes hydrogen annealing to close the pores of the porous layer 4 so as to make it non-porous or forming a non-porous monocrystalline layer by epitaxial growth. In addition, the surface of the non-porous layer 5 is oxidized as required, thereby forming an insulating layer 6 on the non-porous layer 5. Instead of oxidization, the insulating layer 6 may be formed by CVD or sputtering and the like. In this embodiment, a porous layer 4 is employed as a separation layer.

Figure 4C:
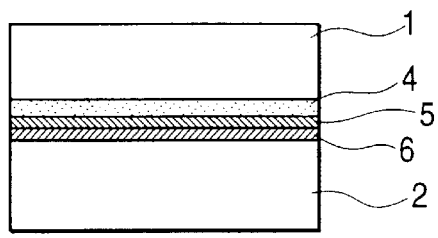

As shown in FIG. 4C, the surface of an insulating layer 6 of the first wafer 1 and the surface of the second wafer 2 are bonded with each other to form a multilayer structure.

The second wafer 2 may be a wafer on which a semiconductor is exposed or may have an insulating film formed on its surface. Alternatively, instead of the second wafer, an insulating light transmission substrate such as quartz glass may be employed. Alternatively, a plastic-based flexible film may be employed.

In this bonding, the surfaces of these wafers may be subjected to heat treatment in contact with each other at room temperature to increase bonding strength, and may be bonded with each other by anode bonding. Alternatively, heat treatment may be carried out at the same time as when they come into contact with each other. Further, in the bonding step, heat treatment or the like may be carried out while they are pressurized so as to come into closer contact with each other. Heat treatment is preferably carried out in an oxidizing atmosphere or an inert gas atmosphere ($N_2$, Ar or the like).

In addition, it is preferable to activate a bonding face in advance by applying plasma treatment using oxygen, nitrogen, silicon, hydrogen, rare gas or the like to at least either one of a pair of bonding faces. Further, a bonding layer may be intervened between these faces for bonding.

Figure 4D:
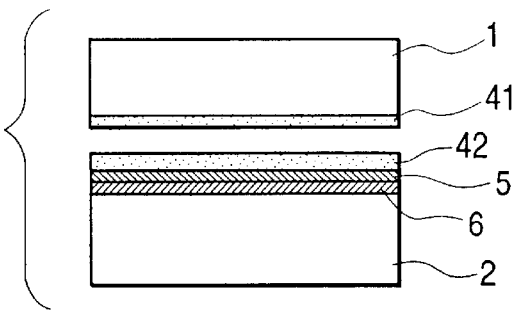

As shown in FIG. 4D, at a separation layer (porous layer 4), a multilayer structure is separated by the aforementioned method (reference numerals 41 and 42 each designate a separated porous layer). A non-porous portion of the peeled first wafer 1 is maintained to a wafer shape, and a remaining portion 41 of the porous layer is provided on a separated face. On the other hand, a non-porous layer 5 transferred from the first wafer is provided on the second wafer 2 together with the insulating layer 6. A remaining portion 4B of the porous layer is provided on its separated face. On the drawing, although the separation position is drawn so as to be inside of the porous layer, of course, an interface between the first wafer 1 and the porous layer 4 or an interface between the non-porous layer 5 and the porous layer 4 may be at the separation position. This is the same in the subsequent embodiments.

Figure 4E:
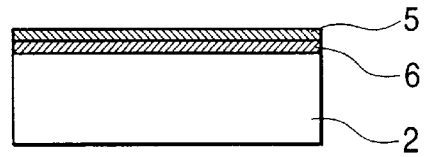

As shown in FIG. 4E, a remaining portion 42 of the porous layer is removed. When the thickness of the remaining portion 42 is relatively thick, a mixture liquid of fluoric acid, hydrogen peroxide, and alcohol is employed as an etchant, the remaining portion 42 is selectively removed by wet etching, and then, the surface is smoothened by hydrogen annealing. If the thickness of the remaining portion 42 is thin, the remaining portion 42 may be removed by hydrogen annealing without wet etching, and at the same time, smoothing treatment may be carried out. Thus, a highly value-added SOI wafer is obtained. The polishing or planing step may be added to the removing step of the remaining portion 42.

Figure 4F:
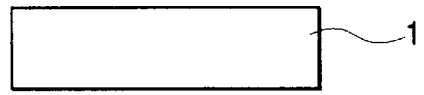

In FIG. 4F, the remaining portion 41 on the wafer 1 (semiconductor substrate) after peeling is removed, smoothed, and smoothened by polishing, planing, wet etching, or hydrogen annealing and the like. Thus, a bulk wafer is obtained. Here, on the first wafer on which the remaining portion 41 has been merely removed, i.e., on which the remaining portion 41 has been removed without smoothing its surface, epitaxial growth (FIG. 4G) may be carried out for the surface smoothing step.

Figure 4G:

As shown in FIG. 4G, an epitaxial layer 7 consisting of a non-porous P-type monocrystalline semiconductor may be formed by carrying out epitaxial growth treatment on the surface of the wafer 1 after peeling. Thus, an epitaxial wafer is obtained. That is, one SOI wafer (FIG. 4E) and one bulk wafer (FIG. 4F) or an epitaxial wafer (FIG. 4G) are obtained from two semiconductor wafers. In the present invention, this bulk wafer (epitaxial wafer) is employed for uses other than the aforementioned first and second wafers. For example, the wafer is used for fabricating a solar cell, is used as a dummy wafer or a monitor wafer, or is for sale as an epitaxial wafer.

After separation, in the case where a separation layer remaining on the first or second wafer is very thin, there is almost no such layer, or there is no problem even if the layer remains, the step of removing the above remaining portion can be eliminated, which is the same in the subsequent embodiments.

As has already been described, when a high concentration P-type semiconductor wafer is employed as a first wafer, the wafer is preferable to make it porous. The epitaxial wafer obtained in FIG. 4G is a wafer having an epitaxial layer (for example, P$^-$ layer) formed on the P$^+$ wafer.

Here, prior to forming the non-porous layer 5 on the porous layer 4, at least one of the following steps (1) to (4) can be added. A series of steps may be performed in order of (1)→(2) preferably, (1)→(2)→(3) or (1)→(2)→(4) more preferably, and (1)→(2)→(3)→(4) more preferably.

(1) Step of Forming a Protective Layer on the Wall of the Pores

A protective film such as oxide film or nitride film may be provided on the wall of the pores in a porous layer to prevent pores from becoming coarse due to heat treatment. For example, heat treatment (200° C. to 700° C.) is carried out under an oxidizing atmosphere. An oxide film or the like formed on the surface of the porous layer may be removed, as required (for example, a surface is exposed to a liquid containing HF.).

(2) Hydrogen Baking Step

A porous layer is subjected to heat treatment at 800° C. to 1200° C. in a reducing atmosphere containing hydrogen, thereby sealing pores existing on the layer surface of the porous layer to some extent.

(3) Step of Supplying a Very Small Amount of Raw Material

If pores cannot be sealed by the above hydrogen baking process, a small amount of raw material of the non-porous layer 5 is supplied, thereby further sealing pores on the layer surface.

Specifically, the supply of the raw material is adjusted so that the growth rate is 20 nm/min. or less, preferably 10 nm,/min. or less, more preferably 2 nm/min. or less.

(4) High-temperature Baking Step

Heat treatment is carried out at a temperature higher than a treatment temperature for the aforementioned hydrogen baking step and/or the step of supplying a small amount of raw material and under a hydrogen-containing reducing atmosphere, In this manner, more complete sealing and smoothing on the surface of the porous layer can be achieved.

Embodiment 2

FIGS. 5A to 5I are schematic views showing a method for manufacturing a wafer according to a Second Embodiment of the present invention.

Figure 5A:
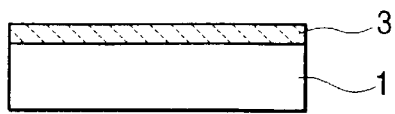
FIGS. 5A, 5B, 5C, 5D, 5E, 5F, 5G, 5H and 5I are process diagrams showing a process for manufacturing a wafer according to a second embodiment of the present invention.

First, as shown in FIG. 5A, a first wafer 1 consisting of a bulk wafer such as a CZ silicon wafer, an FZ silicon wafer or the like is provided; and a dopant-added monocrystalline semiconductor layer 3 is formed on the top layer of the first wafer using a diffusion method or an ion implantation method. This monocrystalline semiconductor layer 3 is preferably a P$^+$ layer having a boron concentration of $1 \times 10^{17}$ cm$^{-3}$ to $1 \times 10^{20}$ cm$^{-3}$.

Figure 5B:
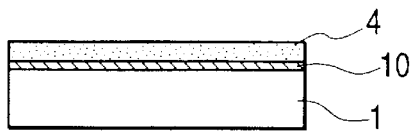

Next, as shown in FIG. 5B, the surface of the monocrystalline semiconductor layer 3 of the first wafer 1 is subjected to anodization to make it porous, and a porous layer 4 is formed. At this time, it is preferable to make only the top layer of the monocrystalline semiconductor layer 3 porous so that a non-porous layer 10 remains below the porous layer 4 with a thickness of about 100 nm to 20 μm. Thus, a region in which the boron concentration is strictly specified can be subjected to anodization, and an evenly porous face can be formed.

Figure 5C:
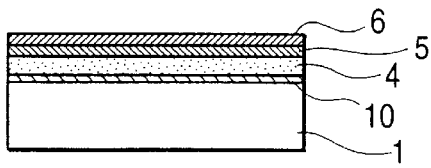

Then, in FIG. 5C, a non-porous layer 5 is formed on a porous layer 4, and a first member is formed. A method for forming the non-porous layer 5 includes closing the pores in the porous layer 4 to make the top layer non-porous by hydrogen annealing or forming a non-porous monocrystalline layer by epitaxial growth. The surface of the non-porous layer 5 is oxidized as required to form an insulating layer 6 on the non-porous layer 5. Instead of heat oxidizing, the insulating layer 6 may be formed by CVD or sputtering and the like. In this embodiment, the porous layer 4 is employed as a separation layer.

Figure 5D:
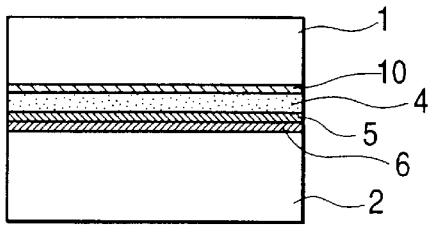

In FIG. 5D, the surface of the insulating layer 6 of the first wafer 1 and the surface of the second wafer 2 are bonded with each other to form a multilayer substrate. As a second wafer 2, a bulk wafer such as a CZ silicon wafer, an FZ silicon wafer or the like can be employed. The second wafer may be a wafer on which a semiconductor is exposed or may have an insulating layer formed on its surface. Alternatively, an insulating light transmission substrate such as quartz glass may be employed instead of the second wafer.

In addition, it is preferable to activate in advance a bonding face by applying plasma treatment using oxygen, nitrogen, silicon, hydrogen, rare gas or the like to at least either one of a pair of bonding faces. Further, a bonding layer may be intervened between these faces.

Figure 5E:
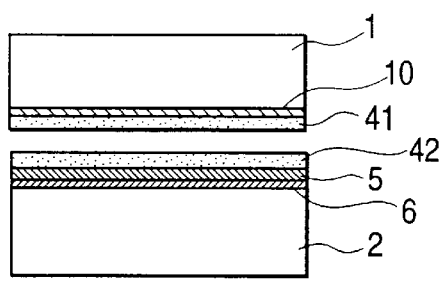

In FIG. 5E, at a separation layer (a porous layer 4), a multilayer structure is separated by the aforementioned method. The non-porous portion of the peeled-first wafer is maintained to a wafer shape, and has a remaining portion 41 of the porous layer on the separated face. On the other hand, the non-porous layer 5 transferred from the first wafer is provided on the second wafer 2 together with the insulating layer 6, and has a remaining portion 42 of the porous layer on its separated face.

Figure 5F:
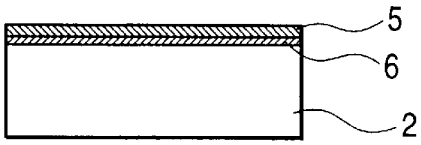

In FIG. 5F, a remaining portion 42 is removed. When the thickness of the remaining portion 42 is relatively thick, a mixture of hydrofluoric acid, hydrogen peroxide, and alcohol is employed as an etchant, the remaining portion 42 is selectively removed by wet etching, and then, the surface is smoothed by hydrogen annealing. When the thickness of the remaining portion 42 is thin, the remaining portion 42 may be removed by hydrogen annealing without wet etching, and at the same time, smoothing treatment may be carried out. Thus, a highly value-added SOI wafer is obtained.

Figure 5G:

In FIG. 5G, the remaining portion 41 on the wafer 1 after peeling (semiconductor substrate) is removed by polishing, planing, wet etching, hydrogen annealing or the like, and is smoothed.

Figure 5H:
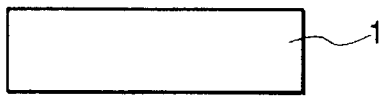

In addition, when a non-porous layer 10 is removed, a bulk wafer which is the same as the initial wafer is obtained (FIG. 5H).

Figure 5I:
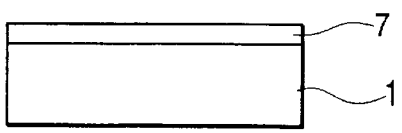

Further, as shown in FIG. 5I, after epitaxial growth treatment has been carried out on the surface of the wafer 1 after peeling, an epitaxial layer 7 consisting of a non-porous P-type monocrystalline semiconductor is formed, and then an epitaxial wafer is obtained. That is, one SOI wafer and one bulk wafer (FIG. 5H) or epitaxial wafer (FIG. 5I) are obtained from two wafers. The bulk wafer (epitaxial wafer) is employed for uses other than the fabrication of the SOI wafer shown in FIGS. 5A to 5I. For example, the wafer is employed as an apparatus wafer for fabricating a solar cell, a MOS transistor or the like, is used as a monitor wafer or a dummy wafer, or is sold as a bulk wafer or an epitaxial wafer.

Embodiment 3

A method for manufacturing a wafer according to a Third Embodiment of the present invention is described below by referring to FIGS. 5A to 5I again.

First, as shown in FIG. 5A, a first wafer 1 consisting of a bulk wafer such as a CZ silicon wafer, an FZ silicon wafer or the like is provided; and a monocrystalline semiconductor layer 3 is formed on its surface by an epitaxial growth treatment. This monocrystalline semiconductor layer 3 is preferably a P$^+$ layer having a boron concentration of $1 \times 10^{17}$ cm$^{-3}$ to $1 \times 10^{20}$ cm$^{-3}$ defining P-type conductivity.

Next, as shown in FIG. 5B, the surface of the monocrystalline semiconductor layer 3 of the first wafer 1 is subjected to anodization to make it porous, and a porous layer 4 is formed. At this time, it is preferable to make only the top layer of the epitaxial layer 3 porous so that a non-porous epitaxial layer 10 remains below the porous layer 4 with a thickness of about 100 nm to 20 μm.

Then, in FIG. 5C, a non-porous layer 5 is formed on a porous layer 4, and a first member is formed. A method for forming the non-porous layer 5 includes closing the pores in the porous layer 4 to make the top layer non-porous by hydrogen annealing or forming a non-porous monocrystalline layer by epitaxial growth. The surface of the non-porous layer 5 is oxidized as required to form an insulating layer 6 on the non-porous layer 5. Instead of heat oxidizing, the insulating layer 6 may be formed by CVD or sputtering and the like. In this embodiment, the porous layer 4 is employed as a separation layer.

In FIG. 5D, the surface of the insulating layer 6 of the first wafer 1 and the surface of the second wafer 2 are bonded with each other to form a multi-layered substrate. A second wafer 2 consisting of a bulk wafer such as a CZ silicon wafer, an FZ silicon wafer or the like may be a wafer on which a semiconductor is exposed or may have an insulating layer formed on its surface. Alternatively, an insulating light transmission substrate such as quartz glass may be employed instead of the second wafer. During the bonding, these surfaces may be subjected to heat treatment in contact with each other at room temperature to increase bonding strength, and may be bonded by anode bonding. Alternatively, heat treatment may be carried out at the same time when these surfaces come into contact with each other. Further, in the bonding step, heat treatment or the like may be carried out while they are pressurized so as to come into closer contact with each other.

In addition, it is preferable to activate in advance a bonding face by applying plasma treatment using oxygen, nitrogen, silicon, hydrogen, rare gas or the like to at least either one of a pair of bonding faces.

Further, a bonding layer may be intervened between these faces.

In FIG. 5E, at a separation layer (a porous layer 4), a multilayer structure is separated by the aforementioned method. The non-porous portion of the peeled first wafer is maintained to a wafer shape, and has a remaining portion 41 on the porous layer on the separated face. On the other hand, the non-porous layer transferred from the first wafer is provided on the second wafer 2 together with the insulating layer 6, and has a remaining portion 42 of the porous layer on its separated face.

In FIG. 5F, a remaining portion 42 is removed. When the thickness of the remaining portion 42 is relatively thick, a mixture of hydrofluoric acid, hydrogen peroxide, and alcohol is employed as an etchant, the remaining portion 42 is selectively removed by wet etching, and then, the surface is smoothed by hydrogen annealing. When the thickness of the remaining portion 42 is thin, the remaining portion 42 may be removed by hydrogen annealing without wet etching, and at the same time, smoothing treatment may be carried out. Thus, a highly value-added SOI wafer (FIG. 5F) is obtained.

In FIG. 5G, the remaining portion 41 on the wafer 1 after peeling (semiconductor substrate) is removed by polishing, wet etching, hydrogen annealing or the like, and is smoothened. At this time, the epitaxial layer 10 formed in FIG. 5A remains. When hydrogen annealing is applied in this state, the surface is smoothened. In addition, the concentration of boron contained is lowered by outward diffusion, and the layer 10 is formed as a P⁻ type monocrystalline semiconductor layer. This is a wafer of the same quality as a so-called P⁻ epitaxial wafer. If there is no need for positively conducting outward diffusion, even if the surface is smoothed by polishing or short-time hydrogen annealing, a wafer of the same quality as the P⁻ epitaxial wafer is formed. An epitaxial layer may be epitaxially grown on the layer 10.

In addition, when the layer 10 is removed, a bulk wafer which is the same as the initial wafer is obtained (FIG. 5H).

Further, as shown in FIG. 5I, after epitaxial growth treatment has been carried out on the surface of a wafer 1 after peeling, an epitaxial layer 7 consisting of a non-porous P-type monocrystalline semiconductor is formed as an epitaxial wafer. That is, one SOI wafer and one epitaxial wafer or bulk wafer are obtained from two wafers. This non-SOI wafer is diverted or is sold for other use without being used for manufacturing an SOI wafer again.

Hereinafter, an advantage in the case where one SOI wafer and one epitaxial wafer is fabricated from two silicon wafer will be described with reference to FIG. 15A to FIG. 15H.

Figure 15A:
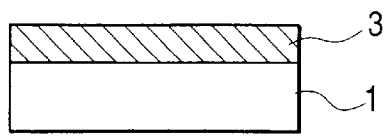
FIGS. 15A, 15B, 15C, 15D, 15E, 15F, 15G and 15H are process diagrams showing a process for manufacturing a wafer of the present invention.

As shown in FIG. 15A, an epitaxial silicon layer 3 is formed on a bulk silicon substrate 1.

Figure 15B:
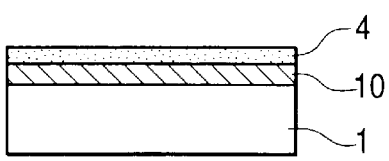
Figure 15C:
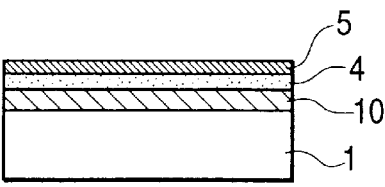
Figure 15D:
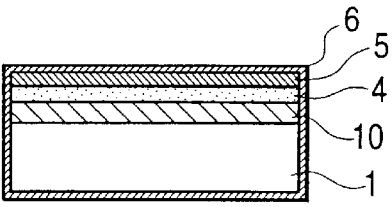
Figure 15E:
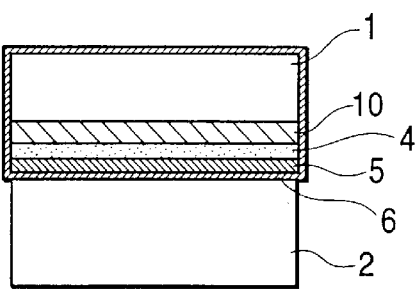
Figure 15F:
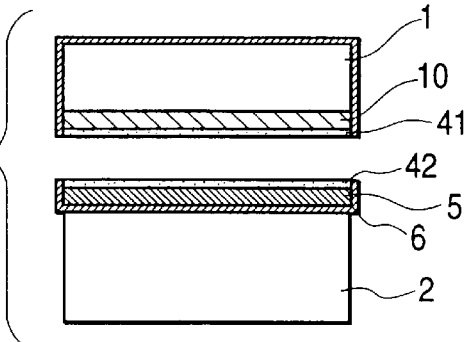
Figure 15G:
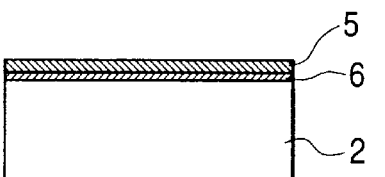
Figure 15H:
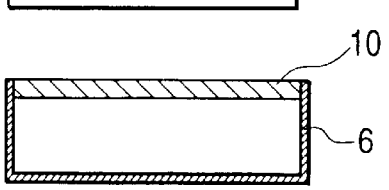

Next, as shown in FIG. 15B, a part of the epitaxial layer 3 is subjected to anodization, thereby making it porous, and a porous layer (a separation layer) 4 is formed. Then, a non-porous monocrystalline silicon layer 5 being an active layer of the SOI wafer is formed on the porous layer 4 (FIG. 15C). Further, an oxide film 6 being a part of the insulating film of the SOI wafer is formed (FIG. 15D). At this time, as shown in the figure, an oxide film is also formed on the surface of the silicon substrate 1. A second silicon wafer 2 is bonded thereto (FIG. 15E). In this bonding, heat treatment may be carried out at an oxidizing atmosphere so that bonding force is strengthened, and the oxide film on the surface of the silicon substrate 1 can be thickened as well. Thereafter, the bonded substrates are separated (FIG. 15F), the remaining porous layers 41 and 42 are removed, thereby making it possible to obtain a SOI wafer (FIG. 15G) and an epitaxial wafer (FIG. 15H).

In the process step, an epitaxial wafer for forming an apparatus is employed in order to prevent diffusion of impurities from the wafer to the outside while an oxide film being a back shield is attached to the surface, in particular, to the back face of the substrate.

According to the aforementioned step, even if the step of forming a back shield discriminated from the other step is not provided, such back shield is formed in a series of the steps of fabricating the SOI wafer. Thus, an epitaxial wafer can be fabricated very effectively.

In particular, the thickness of the back surface oxide film of the epitaxial wafer (FIG. 15H) obtained through a series of SOI wafer fabricating steps is preferably controlled to be 10 nm to 10 μm, and more preferably 100 nm to 3 μm.

In FIGS. 15A to 15H, a case in which anodization is employed to form a separation layer has been described. When an SOI wafer is fabricated utilizing a microbubble layer formed by ion implantation, an epitaxial wafer with a back shield can be obtained at the same time as the separation step by containing two oxidizing steps (the oxidizing step of forming a protective film on the surface of a silicon wafer prior to ion implantation and the oxidizing step for increasing bonding strength).

Embodiment 4

FIGS. 6A to 6G are schematic views showing a wafer manufacturing method according to a Fourth Embodiment of the present invention.

Figure 6A:
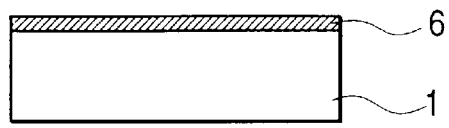
FIGS. 6A, 6B, 6C, 6D, 6E, 6F and 6G are process diagrams showing a process for manufacturing a wafer according to a fourth embodiment of the present invention.
Figure 6B:
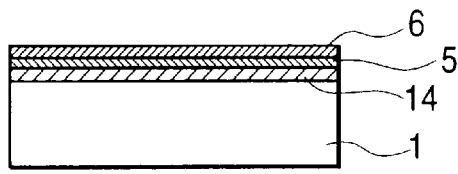

First, in FIG. 6A, a first wafer consisting of a bulk wafer such as a CZ silicon wafer, an FZ silicon wafer or the like is provided. The surface of the first wafer is oxidized as required, thereby forming an insulating layer 6. Then, in FIG. 6B, an ion selected from hydrogen, nitrogen, and rare gas is implanted, a layer 14 containing fine cavities (micro bubbles or micro-cavities) being a separation layer is formed at a predetermined depth. Thus, a first member having a non-porous layer 5 of monocrystalline semiconductor is formed on the separation layer 14.

Figure 6C:
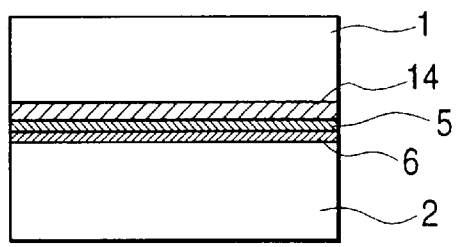

In FIG. 6C, the surfaces of the insulating layer 6 of the first wafer 1 and the surface of the second wafer 2 are bonded with each other to form a multilayer structure. The second wafer may be a wafer on which a semiconductor is exposed, and may have an insulating film such as oxide film formed on its surface. Alternatively, an insulating light transmission substrate such as quartz glass may be employed instead of the second wafer. This bonding may be carried out at room temperature. During the bonding, these surfaces may be subjected to heat treatment in contact with each other at room temperature to increase bonding strength, and may be bonded by anode bonding. Alternatively, heat treatment may be carried out at-the same time when these surfaces come into contact with each other. Further, in the bonding step, heat treatment or the like may be carried out while they are pressurized so as to come into closer contact with each other. In addition, a bonding layer is intervened between these surfaces to be bonded. Further, it is also preferable to carry out plasma treatment using oxygen, nitrogen, silicon, hydrogen, rare gas or the like to at least one of a pair of bonding faces, thereby activating the bonding face in advance.

Figure 6D:
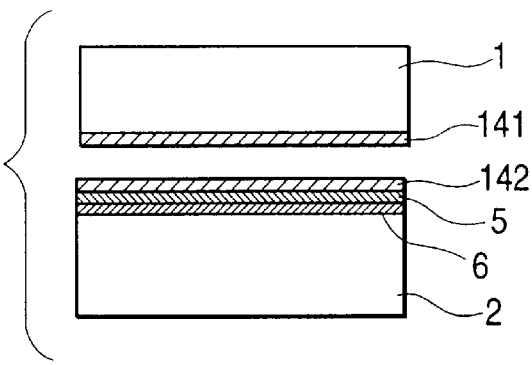

As shown in FIG. 6D, at the separation layer 14, a multilayer structure is separated using the aforementioned method. In this method, when a temperature is set to 400° C. or above during heat treatment in FIG. 6C, a separation phenomenon can occur at the same time as bonding. Preferably, the temperature ranges from 400° C. to 600° C.

The non-porous portion of the peeled first wafer is maintained to a wafer shape, and has a remaining portion 141 of the separation layer 14 on the separated face. On the other hand, on the second wafer 2, the non-porous layer 5 transferred from the first wafer is provided together with an insulating layer 6, and has a remaining portion 142 of the separation layer 14 on the separated face.

Figure 6E:
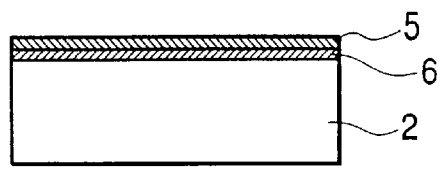

In FIG. 6E, the remaining portion 142 is removed. At this time, the portion may be polished at a low polishing rate, and then, may be subjected to hydrogen annealing. Alternatively, hydrogen annealing may be carried out without polishing the remaining portion 142 to remove it, and at the same time, smoothing treatment may be carried out. Thus, a highly value-added SOI wafer is obtained.

Figure 6F:
Figure 6G:
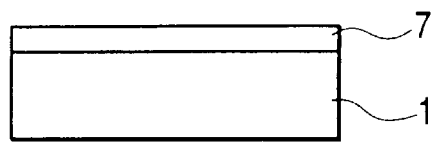

In FIG. 6F, the remaining portion 141 on the wafer 1 (semiconductor substrate) after peeling is removed by polishing, wet etching, hydrogen annealing or the like, and is smoothed. Thus, a bulk wafer is obtained. Further, as shown in FIG. 6G, epitaxial growth treatment may be carried out on the surface of the wafer 1 after peeling as required, thereby forming an epitaxial layer 7 consisting of a non-porous P-type monocrystalline semiconductor. In this case, an epitaxial wafer is obtained.

A high concentration P-type wafer is employed as a first wafer 1, and P$^-$ monocrystalline layer is employed as an epitaxial layer 7, thereby forming a P$^-$ epitaxial/P$^+$ substrate shown in FIG. 6G. In FIG. 6E, when hydrogen annealing is carried out, the high concentration P$^+$ layer 5 gives an SOI wafer (P$^-$ layer) of low concentration by outward boron diffusion. The P$^-$ epitaxial/P$^+$ substrate is diverted to various uses other than the aforementioned SOI wafer fabrication.

Embodiment 5

FIGS. 7A to 7I are schematic views showing a method for manufacturing a wafer according to a Fifth Embodiment of the present invention.

Figure 7A:
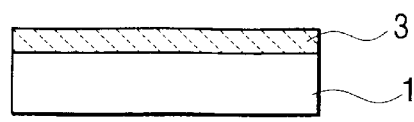
FIGS. 7A, 7B, 7C, 7D, 7E, 7F, 7G, 7H and 7I are process diagrams showing a process for manufacturing a wafer according to a fifth embodiment of the present invention.

First, as shown in FIG. 7A, a first wafer 1 consisting of a bulk wafer such as a CZ silicon wafer, an FZ silicon wafer or the like is provided; and a monocrystalline semiconductor layer 3 is formed on the surface using an epitaxial growth treatment.

Figure 7B:
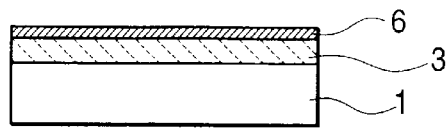
Figure 7C:
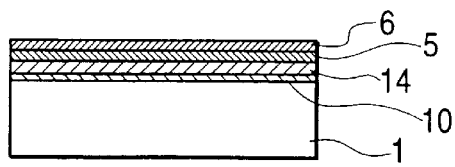

Next, as shown in FIG. 7B, the surface of the epitaxial layer 3 of the first wafer 1 is oxidized as required, thereby forming an insulating layer 6 (FIG. 7B). Then, an ion selected from hydrogen, nitrogen, and rare gas is implanted, so that a layer 14 containing fine cavities being a separation layer is formed at a predetermined depth. Thus, a non-porous layer 5 of monocrystalline semiconductor remains on the separation layer 14, thereby forming a first member (FIG. 7C).

At this time, an ion is preferably implanted-into the epitaxial layer 3 so that a non-porous epitaxial layer 10 remains below the separation layer 14 with a thickness of about 10 nm to 20 μm.

Figure 7D:
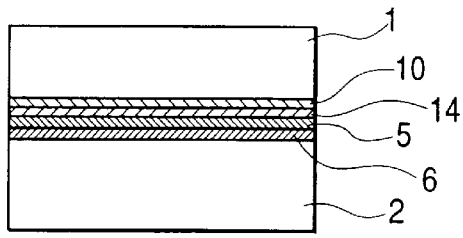

In FIG. 7D, the surface of the insulating-layer 6 of the first wafer 1 and the surface of the second wafer 2 are bonded with each other to form a multilayer substrate. A second wafer 2 being a second member consisting of a bulk wafer such as a CZ silicon wafer, an FZ silicon wafer or the like may be a wafer on which a semiconductor is exposed or may have an insulating layer formed on its surface. Alternatively, an insulating light transmission substrate such as quartz glass may be employed instead of the first wafer. This bonding may be carried out at room temperature. During the bonding, heat treatment may be carried out while these surfaces come into contact with each other at room temperature to increase the bonding strength, and they may be bonded by anode bonding. Alternatively, heat treatment may be carried out at the same time when they come into contact with each other. Further, in the bonding step, heat treatment or the like may be carried out while these surfaces are pressurized to come into closer contact with each other. A bonding layer may be intervened between these surfaces to be bonded. In addition, it is preferable to activate in advance a bonding face by applying plasma treatment using oxygen, nitrogen, silicon, hydrogen, rare gas or the like to at least either one of a pair of bonding faces.

Figure 7E:
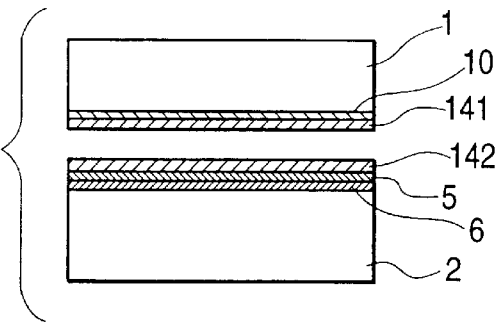

In FIG. 7E, at a separation layer 14, a multilayer porous structure is separated by the aforementioned method. When a temperature is set to 400° C. to 600° C. at the time of heat treatment in step S43, a separation phenomenon will occur at the same time as bonding.

Figure 7F:

The peeled first wafer 1 is maintained to a wafer shape without a decrease in its thickness, and has a remaining portion 141 of the separation layer 14 on the separated face. On the other hand, the non-porous layer 5 transferred from the first wafer is provided on the second wafer 2 together with the insulating layer 6, and has a remaining portion 142 of the separation layer 14 on its separated face. In FIG. 7F, a remaining portion 142 is removed. At this time, polishing may be conducted at a low polishing rate, and then hydrogen annealing may also be conducted. Alternatively, hydrogen annealing may be conducted without polishing, and smoothing treatment may be conducted with removing the remaining portion 142. Thus, a highly value-added SOI wafer is obtained.

Figure 7G:
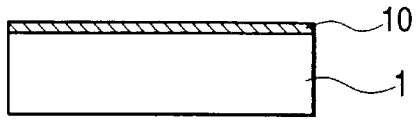

In FIG. 7G, the remaining portion 141 on the wafer 1 after peeling (semiconductor substrate) is removed by polishing, wet etching, hydrogen annealing or the like, and is smoothed. At this time, the epitaxial layer 10 formed in FIG. 7C remains. When hydrogen annealing is applied in this state, the surface is smoothened. In addition, if the boron concentration is high, the concentration of boron contained is lowered by outward diffusion, and the layer 10 is formed as a P⁻ type monocrystalline semiconductor layer.

Figure 7H:

In addition, when the epitaxial layer 10 is removed, a bulk wafer which is the same as the initial wafer is obtained (FIG. 7H).

Figure 7I:
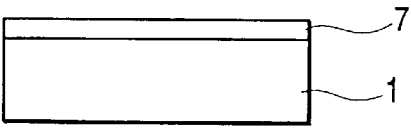

Further, as shown in FIG. 7I, after epitaxial growth treatment has been carried out-on the surface of a wafer 1 after peeling, an epitaxial layer 7 consisting of a non-porous P-type monocrystalline semiconductor may be formed. Thus, an epitaxial wafer is obtained. That is, one SOI wafer and one bulk wafer or epitaxial wafer are obtained from two wafers. In the present invention, the non-SOI wafer is employed for uses other than fabrication of the SOI wafer.

A high concentration P-type wafer is employed as a first wafer 1, and a P⁻ monocrystalline layer is employed as an epitaxial layer 7, thereby causing a P⁻ epitaxial/P⁺ substrate to be formed in step S47. In step S45, when hydrogen annealing is carried out, the high concentration P⁺ layer 5 gives an SOI wafer (P⁻ layer) of low concentration by outward boron diffusion.

Embodiment 6

As a first substrate, a semiconductor substrate such as a silicon wafer is employed. On the semiconductor substrate, a semiconductor layer consisting of a material different from that of a hetero-epitaxially grown substrate is formed by CVD or molecular-beam epitaxial growth method. This semiconductor is SiGe or Ge.

On the other hand, as a second substrate, a silicon wafer is employed.

An insulating film such as an oxide film is formed on at least one of the surface of the semiconductor layer and/or the surface of the second substrate.

The first and second substrates are bonded with each other, and a multilayer structure is obtained.

In the thus obtained multilayer structure, a stress is concentrated on a hetero interface, i.e., an interface between the first substrate and the semiconductor layer, and thus, the multilayer structure is easily peeled at this interface.

Therefore, when energy is applied for the above mentioned separation, it triggers separation of the multilayer structure, and the semiconductor layer is transferred onto the second substrate. The separation face may be somewhat reeled, and smoothing is carried out as required. Thus, one SOI wafer and one silicon wafer (or epitaxial wafer if epitaxial growth is carried out thereon) can be obtained from two silicon wafers. The thus obtained silicon wafer is employed for uses other than the above mentioned step, whereby making it possible to employ always a new silicon wafer for SOI wafer fabrication.

Embodiment 7

FIGS. 8A to 8G are schematic views showing a wafer manufacturing method according to a Seventh Embodiment of the present invention.

Figure 8A:
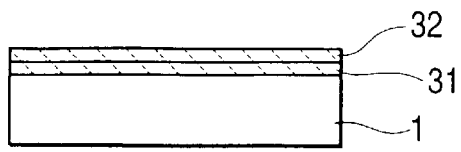
FIGS. 8A, 8B, 8C, 8D, 8E, 8F and 8G are process diagrams showing a process for manufacturing a wafer according to a seventh embodiment of the present invention.

First, in FIG. 8A, a first wafer 1 consisting of a P-type silicon wafer is employed. Then, an epitaxial layer 31 having its impurity concentration lower than the first wafer and an epitaxial layer 32 having its impurity concentration higher than the epitaxial layer 31 are formed by epitaxial growth. For a P-type silicon wafer, a high concentration P-type silicon wafer of $1 \times 10^{17}$ cm⁻³ to $1 \times 10^{20}$ cm⁻³ in boron concentration and 0.001 to 0.5Ω·cm in specific resistance is preferred.

The impurity concentration of the epitaxial layer 32 is required to be higher than that of the epitaxial layer 31. The specific resistance of the epitaxial layer 32 is set to be lower than that of the epitaxial layer 31. Specifically, the specific resistance of the epitaxial layer 31 is set to be 0.02 to 10,000 Ω·cm, and more preferably 0.1 to 100 Ω·cm. The specific resistance of the epitaxial layer 32 is set to be 0.001 to 0.1 Ω·cm, and more preferably 0.005 to 0.02 Ω·cm.

Figure 8B:

In FIG. 8B, the epitaxial semiconductor layer 32 and epitaxial layer 31 of the first wafer 1 is subjected to anodization partway, thereby making them porous, and a porous layer 4 is formed. Even if a current is constant during anodization, when epitaxial layers having their different impurity concentrations are thus employed, a porous layer having its different degree of porousness can be formed. In the porous layer 4, the porous portion of the epitaxial semiconductor layer 31 is more highly porous and more vulnerable than that of the semiconductor layer 32. At this time, the layer is made porous so that the non-porous layer 10 remains below the porous layer 4 with a thickness of 100 nm to 20 μm.

Hereinafter, forming an epitaxial layer having its different impurity concentration will be described in more detail.

At least one of the composition, impurity concentration, and type of an epitaxially grown layer is changed, (in this embodiment, impurity concentration was changed), thereby forming a structure having two or more epitaxially grown layers. When a porous layer formed in such epitaxially grown layer is structured to be porous, the layer having two or more layers having their different structures, a separation position in the porous layer can be specified in the post-bonding separation step described later.

It is desirable that a porous layer structure has a lowly porous layer on its surface side and a highly porous layer therein. The lowly porous layer on the surface side is required to improve crystallinity of a non-porous monocrystalline layer to be formed later. The highly porous layer positioned therein is a layer that is mechanically vulnerable and that is preferentially separated mainly in the highly porous layer or at an interface between the highly porous layer and the adjacent layer in the separation step.

Prior to forming the porous layer, a layer having different composition, impurity concentration, type or the like from the above is formed in advance in an epitaxially grown layer, whereby at least the above mentioned lowly and highly porous layers can be formed without particularly changing the conditions for forming a porous layer during anodization for forming the porous layer.

When a plurality of first substrates are disposed in an anodization solution to form a porous layer, a silicon wafer has been disposed on the anode side as a shield wafer in order to prevent the deposition of a metal ion eluted from the anode to the back side of the first substrate. When two or more porous layers are formed by changing a current density, a similar structure may be formed on the surface of a shield wafer. If such shield wafer is used n-times, a 2n-layered porous layer is formed in the shield wafer. The porous layer becomes extremely unstable. For example, a porous portion formed at the shield wafer has been peeled off at n+1 times, and sometimes has diffused in a container. In particular, when the lowly and highly porous layers are formed alternately, the mechanical strength is lowered more significantly than a case in which a porous layer having the same thickness is formed under constant forming conditions. That is, use of the shield wafer has been limited. However, according to the present invention, a two or more layered structure of the porous layer of the first substrate is determined depending on a structure of the epitaxially grown layer formed in advance on the surface of the first substrate. Thus, the density of current to be applied to the shield wafer can be made constant, and the service life of the shield wafer can be extended.

A two or more layers may be provided for the structure of the porous layer. In particular, a highly porous layer may be formed for a second layer from the surface, and a second lowly porous layer may be formed thereunder. In this situation, even if a defect is introduced during separation, such defect in the porous layer can be removed in the subsequent step of removing the porous layer and the defect does not remain in the first substrate. Thus, when three or more layered structure of the porous layer is formed, a layer having its different composition, impurity concentration, and type, suitable to these porous layers, is formed in an epitaxially grown layer.

Figure 8C:
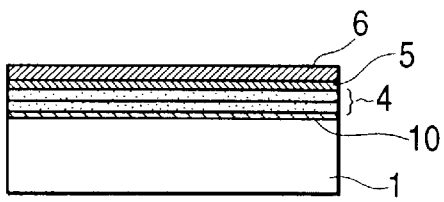

Then, in FIG. 8C, a non-porous layer 5 is formed on a porous layer 4, and a first member is formed. A method for forming the non-porous layer 5 includes closing the pores of the porous layer 4 to make the top layer porous by hydrogen annealing or forming a non-porous monocrystalline layer by epitaxial growth. The surface of the non-porous layer 5 is oxidized as required, thereby forming an insulating layer 6 on the non-porous layer 5. Instead of heat oxidizing, the insulating layer 6 may be formed by CVD or sputtering and the like. In this embodiment a porous portion of the epitaxial semiconductor layer 31 is employed as a separation layer.

Figure 8D:
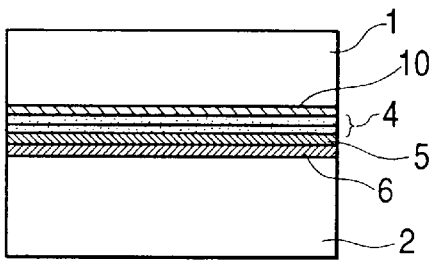

In FIG. 8D, the surface of the insulating layer 6 of the first wafer 1 and the surface of the second wafer 2 are bonded with each other to form a multilayer structure. A second wafer 2 being a second member consisting of a bulk wafer such as a CZ silicon wafer, an FZ silicon wafer or the like is provided. The second wafer may be a wafer on which a semiconductor is exposed or may have an insulating film on its surface. Alternatively, an insulating light transmission substrate such as quartz glass may be employed instead of the second wafer. In bonding, these surfaces may be subjected to heat treatment at room temperature in contact with each other to increase bonding strength or may be bonded with each other by anode bonding. Alternatively, the surfaces may be subjected to heat treatment at the same time when they comes into contact with each other. Further, in the bonding step, heat treatment or the like may be carried out while they are pressurized so as to come into closer contact with each other.

In addition, it is preferable to apply plasma treatment using oxygen, nitrogen, silicon, hydrogen, rare gas or the like to at least one of a pair of bonding faces, and activate in advance these bonding faces. Further, a bonding layer may be intervened between these surfaces to be bonded.

Figure 8E:
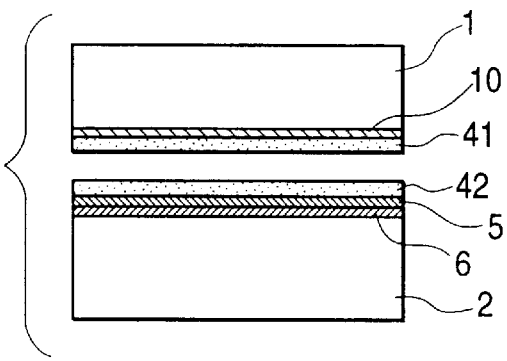

In FIG. 8E, at the separation layer (porous portion of the epitaxial semiconductor layer 31), a multilayer structure is separated by the aforementioned method. The non-porous portion of the peeled first wafer is maintained to a wafer shape, and has a remaining portion 41 of the porous layer on the separated face (a part of the porous portion of the epitaxial semiconductor layer 31). On the other hand, on the second wafer 2, the non-porous layer 5 transferred from the first wafer is provided together with the insulating layer 6, and has a remaining portion 42 of the porous layer on its separated face (a part of the porous portion of the epitaxial layer 32 and the porous portion of the epitaxial semiconductor layer 31).

Figure 8F:
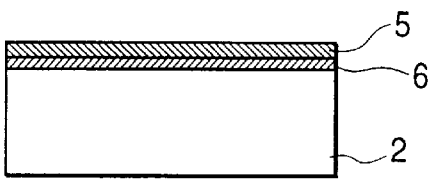

In FIG. 8F, the remaining portion 42 is removed. When the thickness of the remaining portion 42 is relatively thick, a mixture of fluoric acid, hydrogen peroxide, and alcohol is employed as an etchant, and the remaining portion 42 is removed by selectively conducting wet etching on it, and then, the surface is smoothed by hydrogen annealing. When thickness of the remaining portion 42 is thin, hydrogen annealing may be carried out without wet etching, and smoothing treatment may be carried at the same time when the remaining portion 42 is removed. Thus, a highly value added SOI wafer is obtained.

Figure 8G:
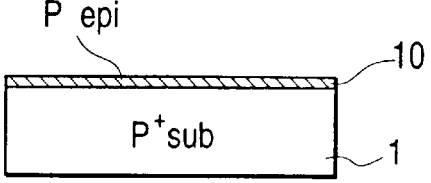

In FIG. 8G, the remaining portion 41 on the wafer 1 (a semiconductor substrate) after peeling is removed by polishing, wet etching, and hydrogen annealing, and is smoothed.

At this time, a non-porous layer (epitaxial layer) 10 remains on the wafer 1, and an epitaxial wafer is obtained. When a wafer other than P-type silicon wafer is desired on a substrate beneath as an epitaxial wafer after separation, a desired silicon wafer (for example, $P^-$ or N type) can be employed.

In these steps, two or more epitaxial semiconductor layers 31 may be formed. For example, when the two epitaxial semiconductor layers are formed, epitaxial semiconductor layers 31' and 31" (31 in all) are formed in this order. The epitaxial semiconductor layers are made porous, which is carried out from the epitaxial semiconductor layer 32 on the surface. Until at least monocrystalline semiconductor layer 31" is made porous, the layers are made porous so that a part of the epitaxial semiconductor layer 31' remains without being made porous. Therefore, when the layer 31' is made porous part-way, the epitaxial semiconductor layer 31', porous layer 41' (a layer obtained by making part of the epitaxial semiconductor layer 31' porous), porous layer 41" (a layer obtained by making the epitaxial semiconductor layer 31" porous), and porous layer 42 (a layer obtained by making the monocrystalline semiconductor layer 32 porous) are formed in that order from the first wafer 1. In addition, when the interface between the monocrystalline semiconductor layer 31" and the monocrystalline semiconductor layer 31' is made porous, the porous layer 41' (a layer obtained by making the single semiconductor layer 31' porous) does not exist.

[Role of Each Layer]

Epitaxial layer 32: A good-quality epitaxial layer (SOI) is formed on this porous layer.

Epitaxial layer 31': A remaining layer without being made porous becomes an epitaxial layer for a second semiconductor substrate.

Epitaxial layer 31": Separation is conducted inside of the thus formed porous layer or at a upper-or lower-interface thereof In FIG. 8G, the remaining portion. 41 on the wafer 1 (semiconductor substrate) after peeling is removed by polishing, wet etching, hydrogen annealing or the like, and is smoothed. At this time, the epitaxial layer 10 (original monocrystalline semiconductor layer 31) formed in FIG. 8A remains. When hydrogen annealing is applied in this state, the surface is smoothed. When the concentration of boron contained is higher than a desired concentration, the boron concentration is lowered by outward diffusion, and the layer 10 is formed as a $P^-$ type monocrystalline semiconductor layer.

This is a wafer of the same quality as a so-called $P^-$ epitaxial wafer. The boron concentration of this layer is substantially equal to that of the initial epitaxial semiconductor layer 31. This layer is made porous in a region close to the surface (porous layer 42), and acts as a separation layer. Thus, there is a possibility that the boron concentration thereof does not match with that for a P⁻ epitaxial wafer. In this case, as described above, two or more epitaxial semiconductor layers 31 having different boron concentrations are arranged, whereby these layers may be formed by being divided into a layer (31″) having its optimum boron concentration to make it porous for separation and a layer (31′) having its optimum boron concentration for a P⁻ epitaxial wafer. If there is no need for positively conducting outward diffusion, even if the surface is smoothed by polishing or short-time hydrogen annealing, a wafer of the same quality as the P⁻ epitaxial wafer is formed. Thus, one SOI wafer and one epitaxial wafer that are highly value-added are obtained from two wafers. This epitaxial wafer is diverted or is sold as a wafer employed for various uses other than being used for manufacturing an SOI wafer, whereby an economically advantageous SOI wafer manufacturing process can be constructed. Moreover, it is possible to manufacture an SOI wafer using a new wafer all the time, and thus, its production efficiency is increased.

Embodiment 8

FIGS. 9A to 9G are schematic views showing a method for manufacturing a wafer according to an Eighth Embodiment of the present invention.

Figure 9A:
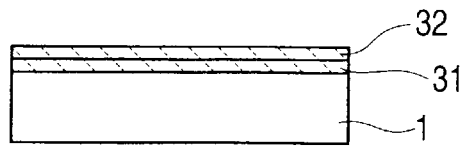
FIGS. 9A, 9B, 9C, 9D, 9E, 9F and 9G are process diagrams showing a process for manufacturing a wafer according to an eighth embodiment of the present invention.

First, in FIG. 9A, a first wafer 1 consisting of a P-type silicon wafer is provided, and an epitaxial layer 31 of a first specific resistance of a first conductive type (for example P⁻) and an epitaxial layer 32 of a second specific resistance of a second conductive type (for example, 'n') are formed on its surface by epitaxial growth. In this embodiment, an epitaxial layer 32 is formed as an active layer on the SOI wafer, and an epitaxial layer 31 is formed as an active layer on the epitaxial wafer. The respective active layers can be fabricated by epitaxial growth of a series of steps. The epitaxial layers 31 and 32 may be of the same conductive type (P type or N type), and the specific resistance may be the same without being changed in particular (that is, a single epitaxial layer may be formed). The monocrystalline semiconductor layers 31 and 32 are finally formed as an epitaxial wafer and a surface semiconductor layer of a wafer such as SOI, and thus, the conductive type and concentration of impurities are preferably optimized for respective uses. As a first wafer, a high concentration P-type silicon wafer is preferably employed.

Figure 9B:
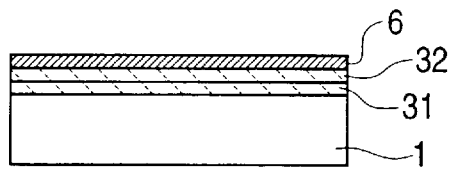
Figure 9C:
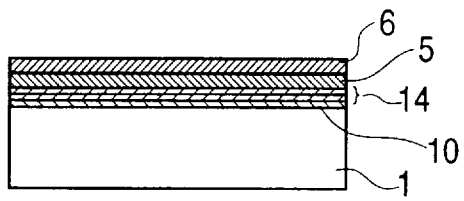

In FIG. 9B, the surface of the epitaxial layer 32 of the first wafer is thermally oxidized etc., thereby forming an insulating layer 6 (FIG. 9C). Next, an ion selected from hydrogen, nitrogen, or rare gas is implanted, and a layer 14 containing fine cavities being a separation layer at a predetermined depth is formed. The position of the separation layer is specified so that at least a part (non-porous layer 5) of the monocrystalline semiconductor 32 remains on the separation layer 14, and further, at least a part (non-porous layer 10) of the monocrystalline semiconductor 31 remains below the separation 14. Thus, a first member is formed.

At this time, it is preferable to implant an ion into the epitaxial layer 31 and/or the epitaxial layer 32 so that a non-porous epitaxial layer 10 (a part of the epitaxial layer 31) remains below the separation layer 14 with a thickness of 10 nm to 20 μm. Here, there is shown a case in which a separation layer 14 is formed so that the interface between the epitaxial layers 31 and 32 exists in the separation layer 14 (that is, in such a manner that a separation layer is formed between the epitaxial layers 31 and 32).

Figure 9D:
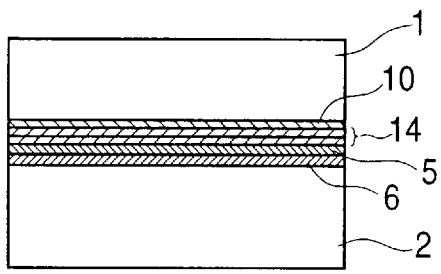

In FIG. 9D, the surface of the insulating layer 6 of the first wafer 1 and the surface of the second wafer 2 are bonded with each other to form a multilayer structure. A second wafer being a second member consisting of a bulk wafer such as a CZ silicon wafer, an FZ silicon wafer or the like may be a wafer on which a semiconductor is exposed or may have an insulating film on its surface. Alternatively, an insulating light transmission substrate such as quartz glass may be employed instead of the first wafer. These surface may be bonded with each other at room temperature. In bonding, the surfaces may be subjected to heat treatment in contact with each other at room temperature to increase bonding strength or may be bonded with each other by anode bonding. Alternatively, heat treatment may be carried out at the same time when these surfaces come into contact with each other. Further, in the bonding step, heat treatment or the like may be carried out. While the surfaces are pressurized so as to come into closer contact with each other. In addition, a bonding layer is intervened between these surface to be bonded. In addition, it is preferable to-apply plasma treatment using oxygen, nitrogen, silicon, hydrogen, rare gas or the like to at least either one of a pair of bonding faces, and activate the bonding face in advance.

Figure 9E:
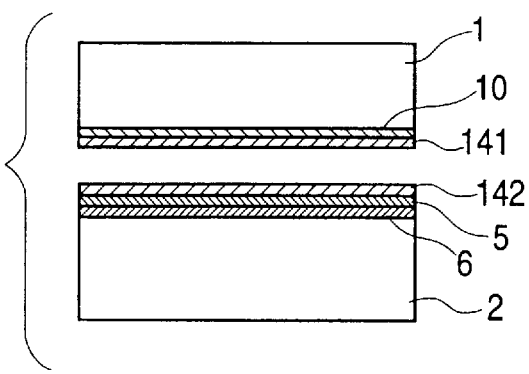

In FIG. 9E, at the separation layer 14, a multilayer structure is separated by the aforementioned method. In the method of this example, when a temperature is set to 400° C. or above and preferably 400° C. to 600° C. during heat treatment shown in FIG. 9D, a separation phenomenon may occur at the same time as bonding.

Figure 9F:
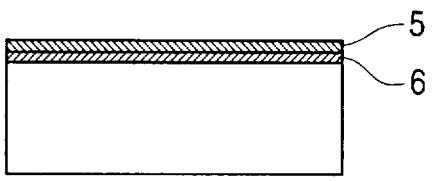

The peeled first wafer 1 is maintained to a wafer shape without a decrease in thickness, and has a remaining portion 141 of the separation layer 14 on the separated face. On the other hand, on the second wafer, a non-porous layer 5 transferred from the first wafer is provided together with an insulating layer 6, and has a remaining portion 142 of the separation layer 14 on its separated face. In FIG. 9F, the remaining portion 142 is removed. The remaining portion 141 is removed by polishing, wet etching, hydrogen annealing or the like, and is smoothed. Thus, a highly value-added SOI wafer is obtained.

In FIG. 9F, the remaining portion 142 is removed. At this time, the remaining portion may be polished at a low polishing rate, and then, may be subjected to hydrogen-annealing. Alternatively, hydrogen annealing may be carried out without polishing, and smoothing treatment may be carried out at the same time when the remaining portion 142 is removed. Thus, a highly value-added SOI wafer is obtained.

Figure 9G:
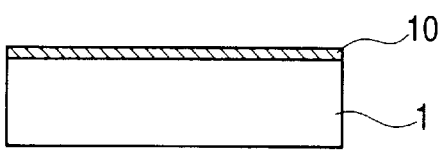

In FIG. 9G, the remaining portion 141 on the wafer 1 (semiconductor substrate) after peeling is removed by polishing, wet etching, hydrogen annealing or the like, and is smoothed. At this time, the epitaxial layer 10 formed in FIG. 9A remains. When hydrogen annealing is applied in this state, the surface is smoothed, and the concentration of boron contained is lowered by outward diffusion, thereby making it possible to employ the layer 10 as a P⁻ type monocrystalline semiconductor layer. Thus, one SOI wafer and one epitaxial wafer (for example, a wafer on which a P⁻ epitaxial layer is formed on a P⁺ substrate) can be obtained from two wafers.

Hereinafter, a manufacturing system (a manufacturing plant) suitable to implement the manufacturing methods of the above embodiments 7 and 8 will be described.

Figure 13:
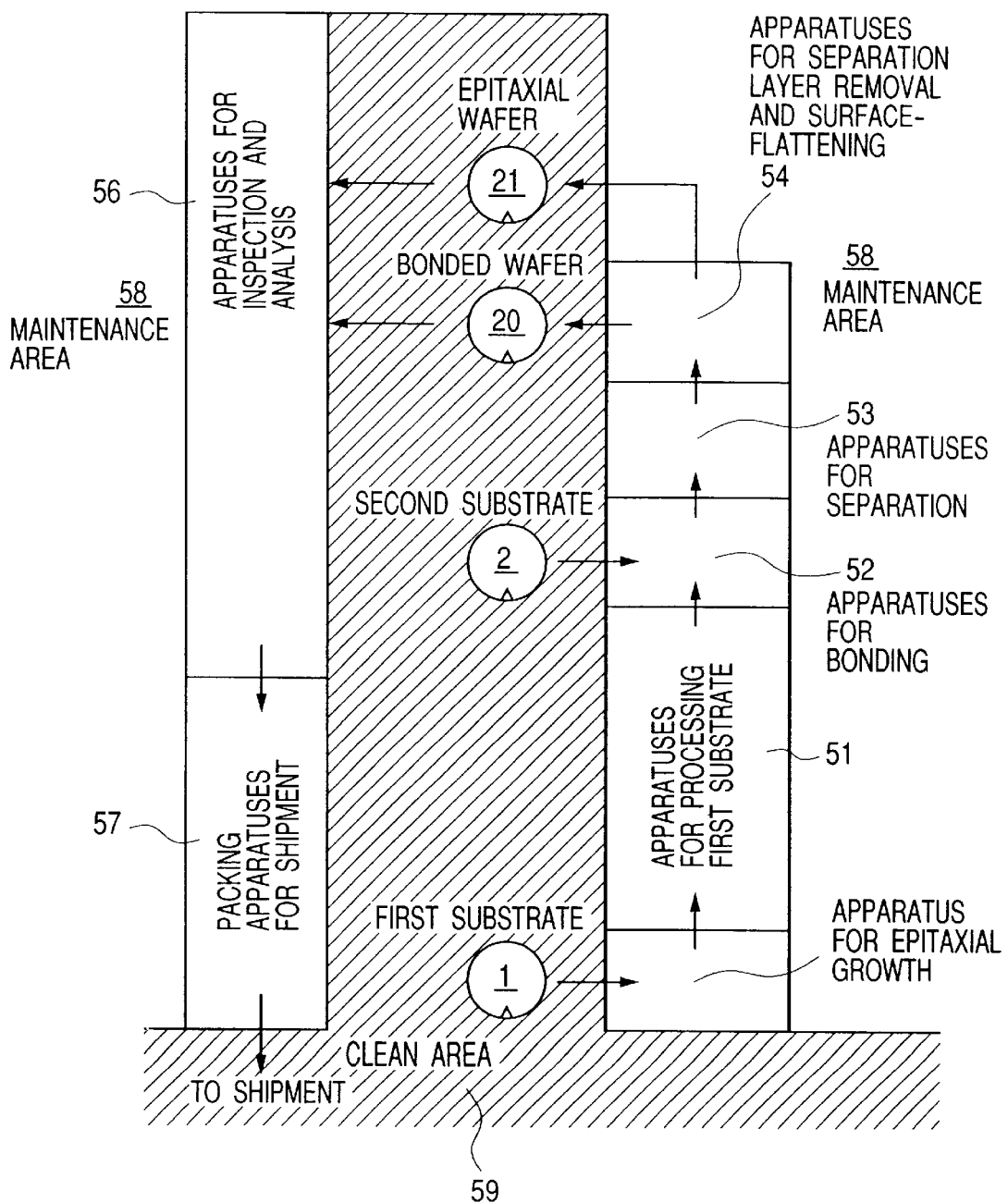
FIG. 13 is an explanatory diagram showing an example of a manufacturing system.

FIG. 13 is a schematic view illustrating an example of the manufacturing system. The manufacturing system of FIG. 13 is merely different from a part of the manufacturing system of FIGS. 6A to 6G, and thus elements identical to those of FIGS. 6A to 6G are designated by the same reference numerals, a description there of will be omitted here.

The manufacturing system of FIG. 13 is different from that of FIGS. 6A to 6G in that an epitaxial layer is formed on a first substrate (wafer) 1, and then, is sent to a group of processing apparatuses 51 having an anodization apparatus, an epitaxial growth apparatus, an ion implanting apparatus, an oxidizing apparatus or the like, i.e., when the peeled first substrate is smoothed at a group of apparatuses 54, the epitaxial wafer 21 is completed (that is, there is no need for performing new epitaxial growth to form an epitaxial layer).

Manufacturing System

Hereinafter, a manufacturing system (a manufacturing plant) suitable to implement a wafer manufacturing method of the present invention will be described.

Figure 10:
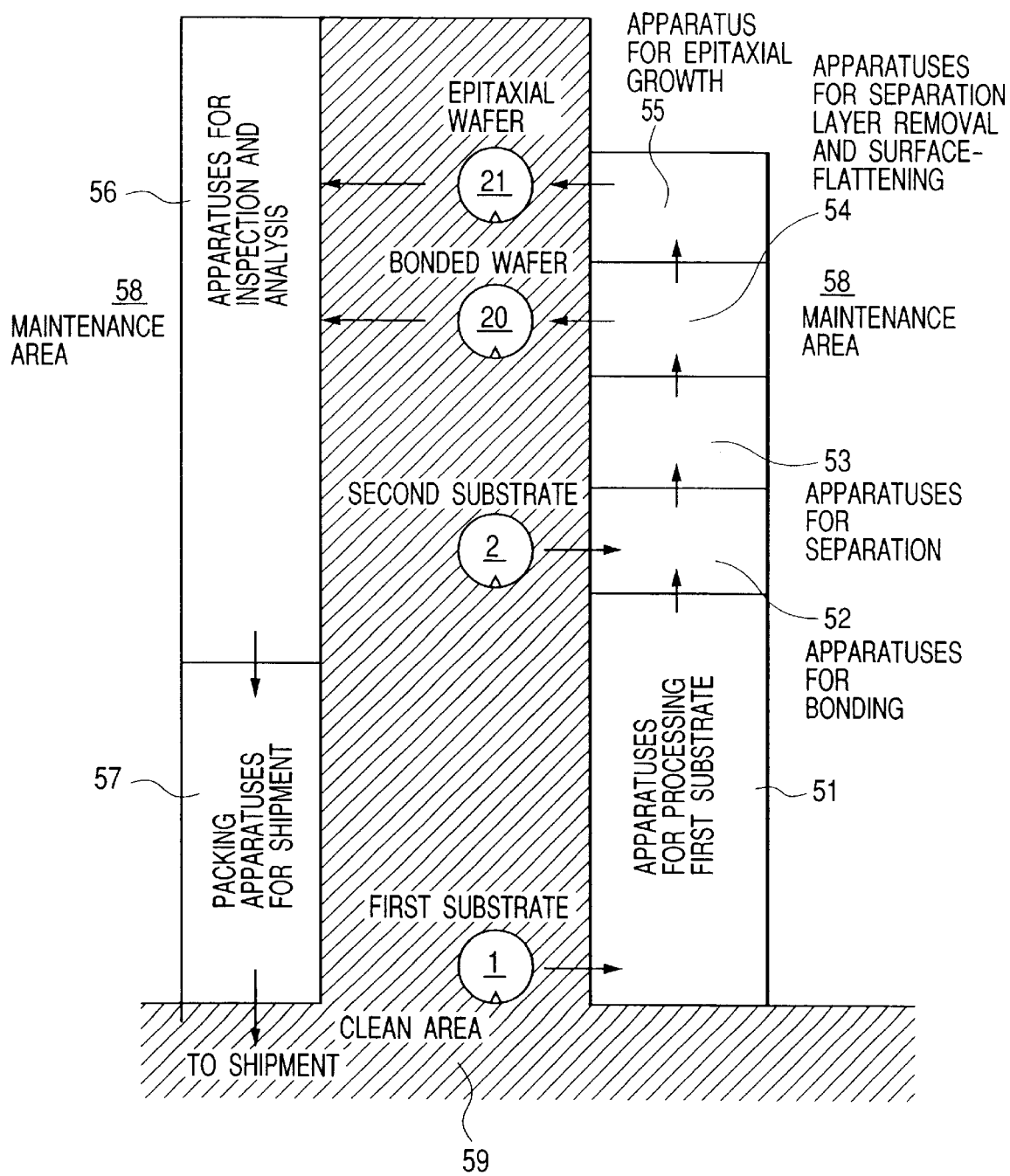
FIG. 10 is an explanatory diagram showing an example of a manufacturing system.

FIG. 10 is a schematic view illustrating an example of the manufacturing system. As shown in the figure, a first substrate (wafer) 1 is sent to a group of processing apparatuses 51 having an anodization apparatus, an epitaxial growth apparatus, an ion implanting apparatus, an oxidizing apparatus or the like, and the aforementioned step S2 or the like is implemented.

The first substrate 1 having a separation layer formed thereon is sent to a group of bonding apparatuses 52, and is bonded with a second substrate (wafer) 2 therein, and a multilayer structure is obtained.

The multilayer structure is sent to a group of separation apparatuses 53 containing at least a water jet apparatus, a teat treatment apparatus, a wedge inserting apparatus or the like, and is separated therein.

The second substrate after peeling is sent to a group of separation-layer-removing and surface-smoothing apparatuses 54 containing an etching apparatus, a polishing apparatus, a heat treatment apparatus or the like. Then, the substrate is subjected to treatment, and an SOI wafer 20 is completed.

On the other hand, the peeled first substrate is smoothed in a group of apparatuses 54 and is completed as a bulk wafer, or is sent to an epitaxial growth apparatus 55. Then, epitaxial growth treatment is applied, and an epitaxial wafer 21 is completed. Of course, in the processing apparatuses 51, when epitaxial growth is conducted on the first substrate 1, an epitaxial wafer is obtained at the same time as when it is separated, thus making it possible to disuse the epitaxial growth apparatus 55.

These SOI wafer 20 and epitaxial wafer 21 (or bulk wafer) are sent to a group of inspection and analysis apparatuses 56; film thickness distribution, foreign particle density, and defect density or the like are measured; and the wafer is packed in a group-of shipment packing apparatuses 57, and is then shipped. The epitaxial wafer 21 is diverted or sold as a wafer for other various uses other than being used as a first substrate 1 or a second substrate 2. Reference numeral 58 designates a maintenance area; and reference numeral 59 designates a clean area for conveying a wafer. Thus, two wafers are employed, and one SOI wafer and one epitaxial wafer (or bulk wafer) can be fabricated. A new wafer can always be employed for manufacture of SOI wafers. An efficient semiconductor manufacturing process can be constructed by diverting a wafer for another uses and selling the wafer that has been conventionally re-utilized in the same process or discarded.

Figure 11:
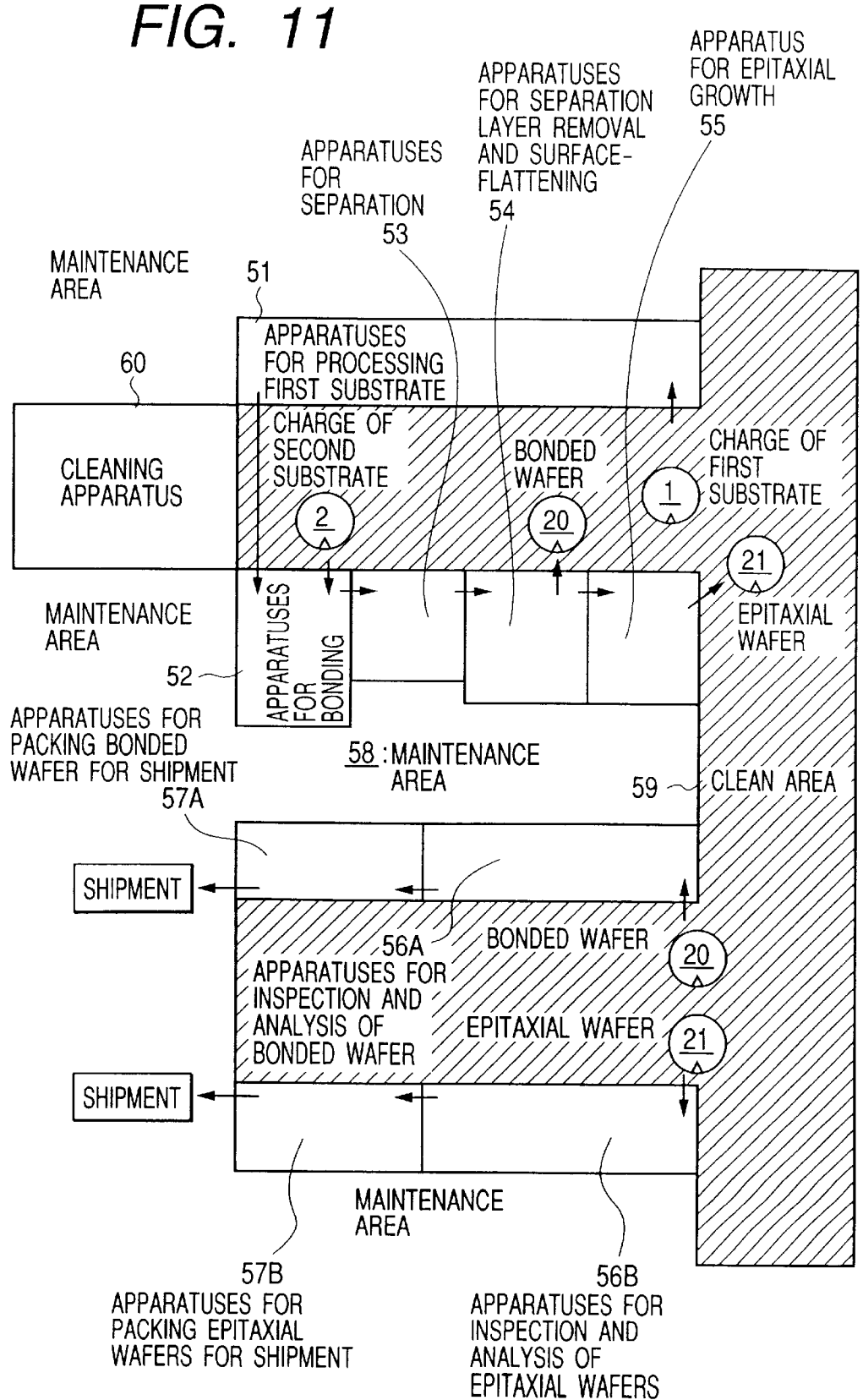
FIG. 11 is an explanatory diagram showing another example of a manufacturing system.

FIG. 11 is a view showing a partial modification of a system of FIG. 10, wherein the obtained SOI wafer 20 and epitaxial wafer 21 (or a bulk wafer) are separately inspected so as to be packed.

In this case, when the epitaxial wafer 21 is required to have the same quality as the obtained SOI wafer 20, the epitaxial wafer 21 (or a bulk wafer) is not used as a first substrate 1 or a second substrate 2 again. Thus, one SOI wafer and one epitaxial wafer can be manufactured from two wafers, and a manufacturing process with its efficient wafer utility can be constructed.

Figure 12:
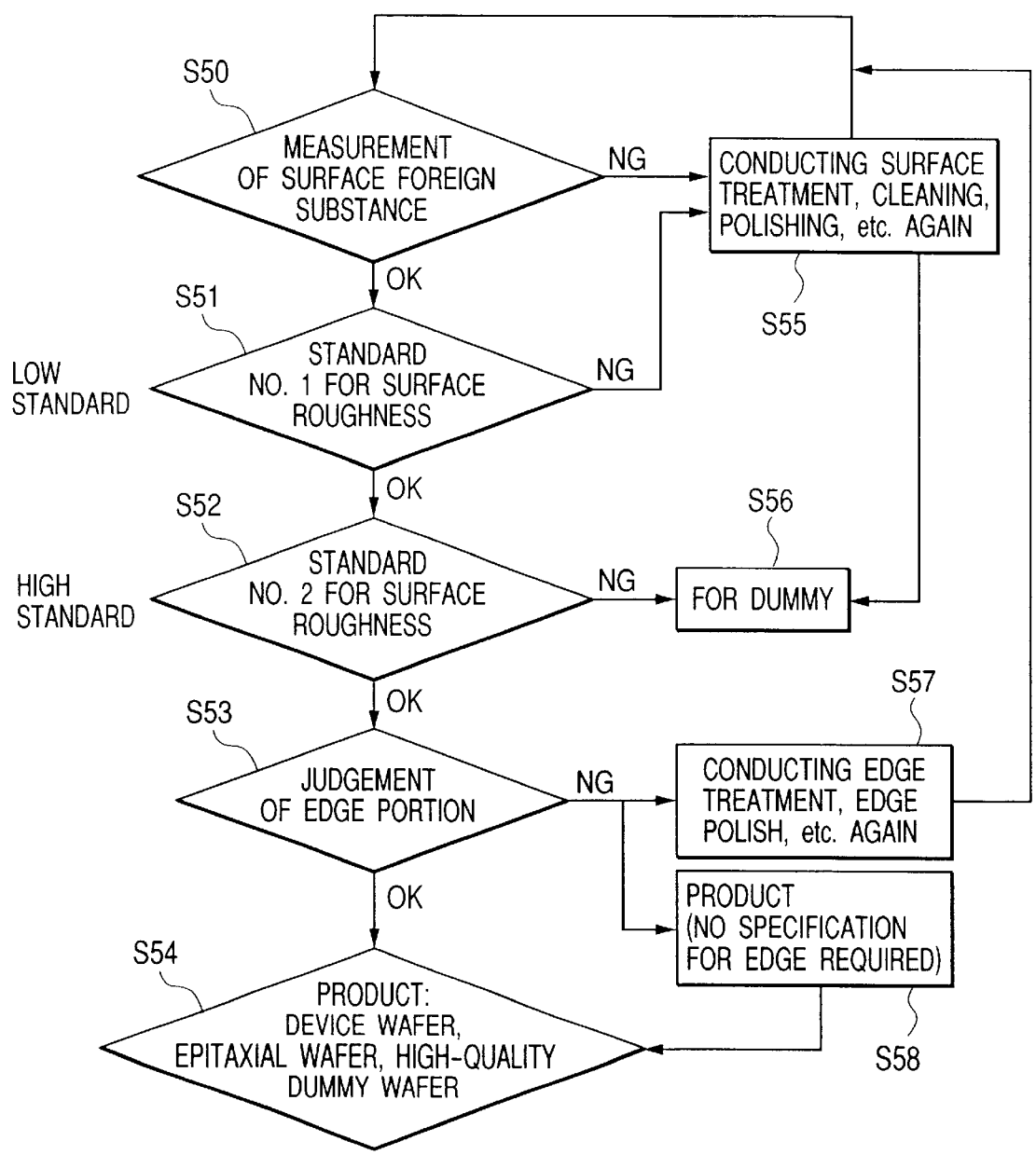
FIG. 12 is a flow chart of an inspection process for determining use to which a first wafer after separation is diverted.

FIG. 12 is a flowchart of the inspection step for determining use to which a first wafer after peeling is diverted.

As shown in FIG. 12, a foreign matter on the surface of the wafer after peeling is first measured (step S50). When a surface foreign matter is not measured or is below a standard value, surface roughness is then measured based on a first standard (low standard) (step S51). When the first standard of the surface roughness is met, the surface roughness is measured based on a second standard (a standard higher than the first standard) (step S52). When the second standard of the surface roughness is met, edge portion judgment is performed (step S53). If there is no problem with an edge portion, the first wafer is produced, and is employed as an apparatus wafer, an epitaxial wafer, or a high-quality dummy wafer (step S54).

When the surface foreign matter exceeds the standard value in step S50 or when surface roughness does not meet the first standard in step S51, surface re-treatment such as re-washing, re-polishing or the like is performed (step S55). After the surface re-treatment, the wafer is inspected again in the steps S50 to S54 or is employed as a dummy wafer if required (step S56). In addition, if the surface roughness does not meet the second standard in step S52, the wafer is employed as a dummy wafer (step S56).

If there is a problem with edge judgment in step S53, edge re-treatment such as edge polishing is performed (step S57). The wafer in which no specification for edge is required is produced as it is, and is employed as an apparatus wafer, a epitaxial wafer, or a high-quality dummy wafer (step S54).

Hereinafter, a manufacturing system (a manufacturing plant) suitable to implement the manufacturing methods of the above embodiments 7 and 8 will be described.

FIG. 13 is a schematic view illustrating an example of the manufacturing system. The manufacturing system of FIG. 13 is partially different from that of FIG. 10, and thus elements identical to those of FIG. 10 are designated by the same reference numerals, and a description thereof is omitted.

The manufacturing system of FIG. 13 is different from that of FIG. 10 in that an epitaxial layer is formed on a first substrate (wafer) 1, and then, is sent to a group of processing apparatuses 51 having an anodization apparatus, an epitaxial growth apparatus, an ion implanting apparatus, an oxidizing apparatus or the like; i.e., when the peeled first substrate is smoothed in a group of apparatuses 54, an epitaxial wafer 21 is completed (that is, there is no need for perform new epitaxial growth to form an epitaxial layer).

Figure 14:
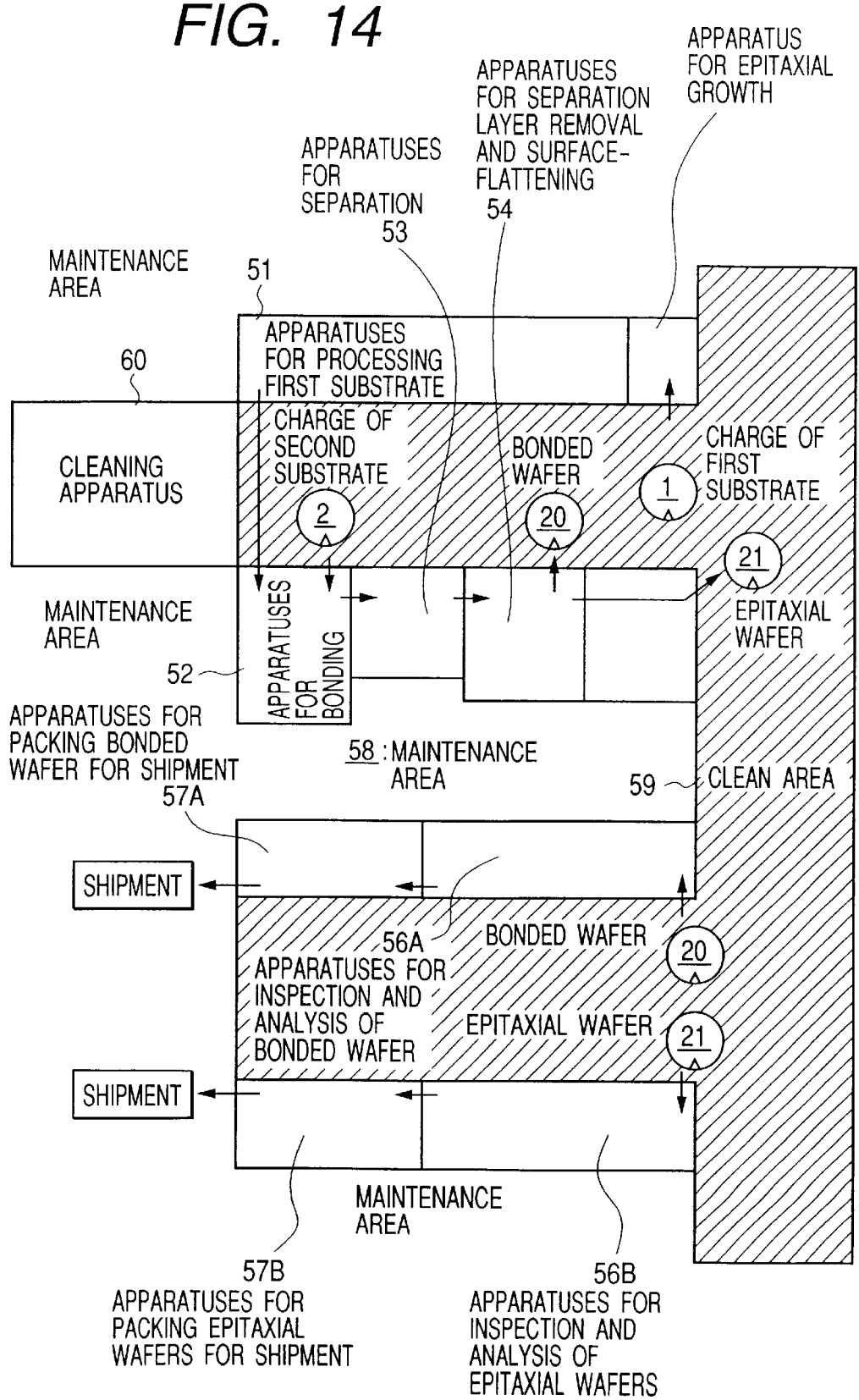
FIG. 14 is an explanatory diagram showing another example of a manufacturing system.

FIG. 14 is a view showing a partial modification of the system of the FIG. 13, wherein the obtained SOI wafer 20 and the epitaxial wafer 21 (or a bulk wafer) are separately inspected, and packed. The manufacturing system of FIG. 14 is partially different from that of FIG. 11. The manufacturing system of FIG. 14 is different from that of FIG. 11 in that an epitaxial layer is formed on the first substrate (wafer) 1, and then, is sent to a group of processing apparatuses 51 having an anodization apparatus, and an epitaxial growth apparatus, an ion implanting apparatus, and an oxidizing apparatus or the like; i.e., when the peeled first substrate is smoothed in a group of apparatuses 54, the epitaxial wafer 21 is completed (that is, there is no need for performing epitaxial growth to form an epitaxial layer.

The inspection step for determining use to which a first wafer after peeling is diverted is the same as the flowchart shown in FIG. 12.

Now, the present invention will be described by way of examples.

In the following examples, it is noted that 80 Torr is equivalent to about $1.07 \times 10^4$ Pa expressed in the SI unit system. Similarly, 760 Torr is equivalent to about $1.01 \times 10^5$ Pa, 0.5 l/min. is equivalent to about 0.0083 L/S, 180 l/min. is equivalent to 3 L/S, and 0.2 l/min. is equivalent to about 0.0033 L/S.

EXAMPLE 1

A first p-type monocrystalline Si substrate showing a specific resistance between 0.01 and 0.02 Ω·cm was anodized in an HF solution.

The conditions of the anodization are listed below.

| | |
|---|---|
| current density | 7 (mA · cm$^{-2}$) |
| anodizing solution | HF:H$_2$O:C$_2$H$_5$OH = 1:1:1 |
| time | 11 (minutes) |
| thickness of porous Si | 12 (μm) |

The porous Si was also used as a separation layer for forming a high quality epitaxial Si layer. Therefore, it was a multi-functional layer. Note that the thickness of the porous Si layer may have a value selected from a range between 0.1 and 600 μm.

The substrate was then oxidized for an hour in an oxygen atmosphere at 400° C. As a result of oxidation, the inner walls of the pores of the porous Si layer were covered by thermally oxidized film. Then, monocrystalline Si was made to epitaxially grow to a thickness of 0.3 μm. The conditions of the epitaxial growth are listed below. Note that the above described hydrogen baking process, the process of supplying a small amount of raw material and the high temperature baking process may be conducted prior to the process of growing monocrystalline Si.

| | |
|---|---|
| source gas | SiH$_2$Cl$_2$/H$_2$ |
| gas flow rate | 0.5/180 l/min. |
| gas pressure | 80 Torr |
| temperature | 950° C. |
| growth rate | 0.15 μm/min. |

Then, a 100 nm thick SiO$_2$ layer was formed on the surface of the epitaxial Si layer by thermal oxidation.

Thereafter, a silicon wafer having the same diameter from the surface of which the native oxide film had been removed was brought into contact with the silicon wafer and bonded together by heat treatment to produce a multilayer structure.

A wedge of a rigid material was driven into the multilayer structure from a lateral side thereof to peel the multilayer structure and remove the first substrate from the multilayer structure. As a result of the peeling, the epitaxial layer was transferred onto the second substrate.

The porous layer remaining on the epitaxial layer was removed by wet etching and the second substrate was subjected to a hydrogen annealing process to obtain an SOI wafer. Then, a fully depletion type thin film transistor was prepared by using the SOI wafer.

On the other hand, the exposed surface of the peeled first substrate was polished to remove the residual porous layer and smoothed to obtain a bulk wafer, which was then used to prepare a CMOS logic circuit.

It was also possible to prepare a solar cell by using the obtained bulk wafer in a manner as described below.

Figure 16A:
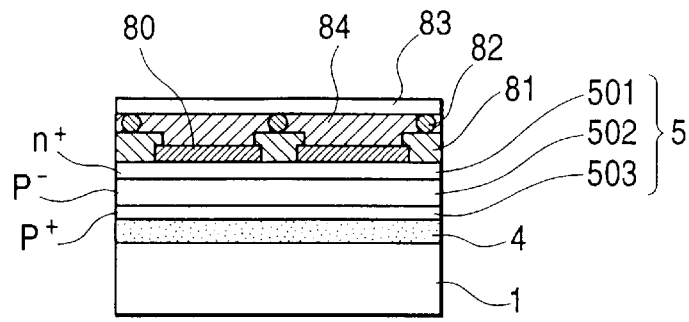
FIGS. 16A, 16B, 16C and 16D are process diagrams showing a process for manufacturing a solar battery of the present invention.
Figure 16B:
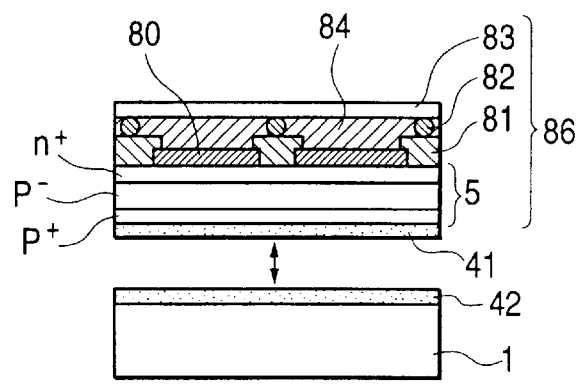

Firstly, after forming a porous layer 4 by anodization, an epitaxial layer 5 was made to grow as shown in FIG. 16A.

More specifically, the epitaxial growth of the semiconductor film 5 was conducted in a manner as described below. A first semiconductor layer 503 of p$^+$ Si was formed by epitaxial growth in an atmospheric pressure Si epitaxial growth system, using SiH$_4$ gas and B$_2$H$_6$ gas to dope the p$^+$ Si of the first semiconductor layer 503 with boron B for 3 minutes to obtain a boron concentration of $10^{19}$ atoms/cm$^3$. Then, a second semiconductor layer 502 was formed in the same system by altering the B$_2$H$_6$ gas flow rate to dope the p$^-$ Si of the second semiconductor layer 502 with boron B for 10 minutes to get a low boron concentration of $10^{16}$ atoms/cm$^3$. Thereafter, a third semiconductor layer 501 was formed on the p$^-$ epitaxial semiconductor layer 502 also by epitaxial growth using PH$_3$ gas in place of B$_2$H$_6$ gas to dope the n$^+$ Si of the third semiconductor layer 501 with phosphor for 4 minutes to get a high phosphor concentration of $10^{19}$ atoms/cm$^3$. Thus, the obtained semiconductor film 5 of the first through third epitaxial semiconductor layers 501 through 503 showed a p$^+$/p$^-$/n$^+$ structure.

Then, in this example, a transparent SiO$_2$ insulating film 80 was formed on the semiconductor film 5 by surface thermal oxidation and subjected to a pattern etching operation using a photolithography technique to make it contact with electrodes or wires 81. The wires 81 were arranged with required intervals to extend in parallel with each other as so many stripes in a direction perpendicular to the drawing.

Each of the electrodes or the wires 81 was made of a metal film prepared as multilayer film by sequentially depositing Ti film, a Pd film and an Ag to respective thicknesses of 30 nm, 50 nm and 100 nm by evaporation and thereafter plating the surface with Ag. The obtained multilayer film was then annealed at 400° C. for 20 to 30 minutes.

Then, a metal wire conductor 82 was bonded to the surface of each of the stripe-shaped electrodes or the wires 81 to extend along the corresponding wire 81 and a transparent substrate 83 was bonded onto the conductors 82. The conductors 82 may be bonded to the electrodes or the wires 81 by soldering. The conductors 82 were extended externally at an end thereof beyond the electrodes or the wires 81.

Thereafter, the bulk wafer 1 and the transparent substrate 83 were subjected to external force trying to separate them from each other. Then, they were separated along the porous layer 4 to produce a thin film semiconductor 86 comprising a transparent substrate 83 and an epitaxial semiconductor film 5 bonded onto the surface of the substrate 83.

Figure 16C:
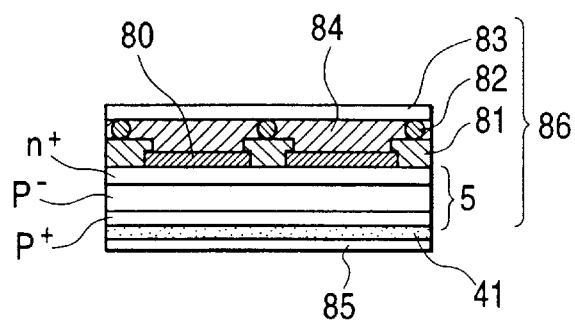

While the porous layer 41 was partly left on the rear surface of the thin film semiconductor 86, silver paste was applied thereon and a metal plate was bonded thereto to produce a rear surface electrode 85 there. Thus, a solar cell comprising a transparent substrate 83 and a thin film semiconductor 86 having a p$^+$/p$^-$/n$^+$ structure was prepared (FIG. 16C). The metal electrode 85 operates also as a device protection film layer protecting the rear surface of the solar cell.

Figure 16D:
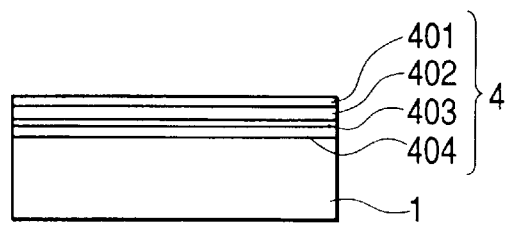
Figure 17A:
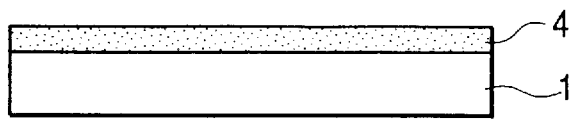
FIGS. 17A, 17B, 17C, 17D and 17E are schematic diagrams showing a prior art process for transferring an epitaxial layer.
Figure 17B:
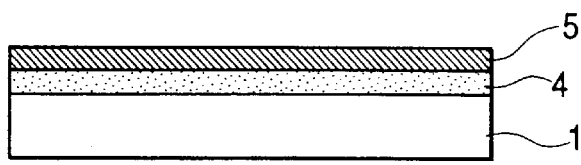
Figure 17C:
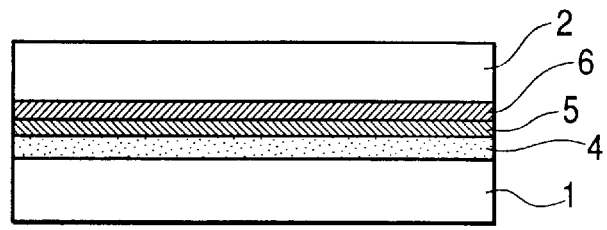
Figure 17D:
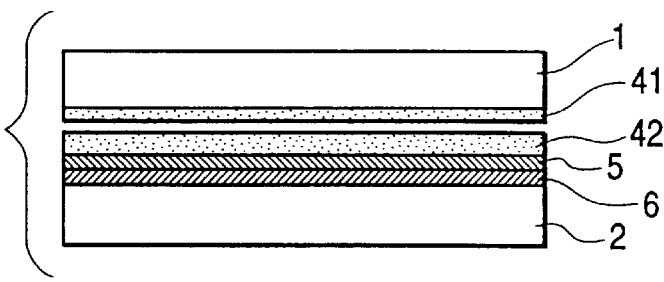
Figure 17E:
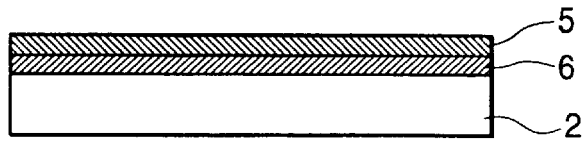

Note that the porous layer 4 may be made to have a multilayer structure of layers with different porosities as shown in FIG. 16D.

For instance, the layer 401 may have a low porosity (to produce a high quality epitaxial film) and the layers 402 and

404 may be made to show a porosity higher than that of the layer 401, while the layer 403 may be made to show the highest porosity of all.

With such an arrangement, the bulk wafer 1 and the transparent substrate 83 can be separated effectively along the high porosity layer 403. Layers with go different porosities can be formed by controlling the current density during the process of forming the porous layer.

EXAMPLE 2

A first p-type monocrystalline Si substrate showing a specific resistance between 0.01 and 0.02 Ω·cm was anodized in an HF solution.

The conditions of the anodization are listed below.

| | |
|---|---|
| current density | 7 (mA · cm$^{-2}$) |
| anodizing solution | HF:H$_2$O:C$_2$H$_5$OH = 1:1:1 |
| time | 5 (minutes) |
| thickness of porous Si | 5.5 (μm) |
| current density | 30 (mA · cm$^{-2}$) |
| anodizing solution | HF:H$_2$O:C$_2$H$_5$OH = 1:1:1 |
| time | 10 (seconds) |
| thickness of porous Si | 0.2 (μm) |

Of the two porous Si layers, the upper one prepared by anodization, using a low current density, was used to form a high quality epitaxial Si layer, whereas the lower one prepared by anodization, using a high current density, was used as a separation layer. Therefore, they have their respective functions.

Note that the thickness of the low current density porous Si layer may have a value selected from a range, between 0.1 and 600 μm. Also note that one or more than one additional layers may be formed after forming the second porous Si layer.

The substrate was then oxidized for an hour in an oxygen atmosphere at 400° C. As a result of oxidation, the inner walls of the pores of the porous Si layers were covered by thermally oxidized film. Then, monocrystalline Si was made to epitaxially grow to a thickness of 0.3 μm by means of CVD. The conditions of the epitaxial growth are listed below. Note that the above described hydrogen baking process, the process of supplying a small amount of raw material and the high temperature baking process may be conducted prior to the process of growing monocrystalline Si.

| | |
|---|---|
| source gas | SiH$_2$Cl$_2$/H$_2$ |
| gas flow rate | 0.5/180 l/min. |
| gas pressure | 80 Torr |
| temperature | 950° C. |
| growth rate | 0.3 μm/min. |

Then, a 200 nm thick SiO$_2$ layer was formed on the surface of the epitaxial Si layer by thermal oxidation.

Thereafter, a silicon wafer having the same diameter from the surface of which the native oxide film had been removed was brought into contact with the silicon wafer and bonded together by heat treatment to produce a multilayer structure.

Water was blown onto a lateral side of the multilayer structure under high pressure by means of a water jet apparatus to make it driven into the multilayer structure like a wedge to peel the multilayer structure and remove the first substrate from the multilayer structure.

As a result of the peeling, the epitaxial layer was transferred onto the second substrate.

The porous layer remaining on the epitaxial layer was removed by wet etching and the second substrate was subjected to a hydrogen annealing process to obtain an SOI wafer. Then, a fully depletion type thin film transistor was prepared by using the SOI wafer.

On the other hand, the exposed surface of the peeled first substrate was polished to remove the residual porous layer and smoothed. Then, the first substrate was subjected to an epitaxial growth process to obtain an epitaxial wafer having a p$^-$ epitaxial layer on the high concentration p-type substrate. It was found that a 600 nm thick oxide film had been formed on the wafer back surface as back shield. When an epitaxial wafer is used for preparing a device, a surface oxide film is formed on the surface opposite to the epitaxial layer and also on the lateral surfaces as a back shield in order prevent impurities from externally diffusing from the wafer.

However, since a back shield had been formed on the rear surface opposite to the epitaxial-layer and also on-the lateral surface of the second substrate when the multilayer structure was peeled, the process of forming a back shield could be omitted from the device preparing process of the example. This was because such a back shield was formed on the rear surface and the lateral surfaces of the wafer in the step of oxidizing the surface of the epitaxial layer preceding the bonding step and during the heat treatment of the bonding step. A similar effect of forming a back shield was observed in the remaining examples. Note that the oxide film has a film thickness of 10 nm to 10 μm, preferably 100 nm to 3 μm.

Thereafter, the epitaxial wafer was used to prepare a CMOS logic circuit.

A DRAM and other devices were formed on the epitaxial wafer to prove that it was useful for improving the quality, the yield and the reliability of manufacturing devices.

The operation of epitaxial growth on the porous Si and that of epitaxial growth on the first substrate after the separation process may be conducted by means of the same CVD system to improve the operating efficiency of the CVD system that is costly in any sense of the word.

EXAMPLE 3

P-type monocrystalline Si showing a specific resistance of 0.015 Ω·cm was formed on a first monocrystalline Si substrate to a thickness of 15 μm by epitaxial growth, using a CVD technique and then anodized from the surface of the substrate in an HF solution.

The conditions of the anodization are listed below.

| | |
|---|---|
| current density | 7 (mA · cm$^{-2}$) |
| anodizing solution | HF:H$_2$O:C$_2$H$_5$OH$_{-1:1:1}$ |
| time | 11 (minutes) |
| thickness of porous Si | 12 (μm) |
| current density | 22 (mA · cm$^{-2}$) |
| anodizing solution | HF:H$_2$O:C$_2$H$_5$OH = 1:1:1 |
| time | 2 (minutes) |
| thickness of porous Si | 3 (μm) |

Of the two porous Si layers, the upper one prepared by anodization, using a low current density, was used to form a high quality epitaxial Si layer, whereas the lower one prepared by anodization, using a high current density, was used as a separation layer. Therefore, they have their respective functions.

The substrate was then oxidized for an hour in an oxygen atmosphere at 400° C. As a result of oxidation, the inner walls of the pores of the porous Si layers were covered by thermally oxidized film. Then, monocrystalline Si was made to epitaxially grow to a thickness of 0.3 µm by means of CVD. The conditions of the epitaxial growth are listed below. Note that the above described hydrogen baking process, the process of supplying a small amount of raw material and the high temperature baking process may be conducted prior to the process of growing monocrystalline Si.

| source gas | $SiH_2Cl_2/H_2$ |
|---|---|
| gas flow rate | 0.5/180 l/min. |
| gas pressure | 80 Torr |
| temperature | 950° C. |
| growth rate | 0.3 µm/min. |

Then, a 200 nm thick $SiO_2$ layer was formed on the surface of the epitaxial Si layer by thermal oxidation.

Thereafter, a silicon wafer having the same diameter from the surface of which the native oxide film had been removed was brought into contact with the silicon wafer and bonded together by heat treatment to produce a multilayer structure.

Water was blown onto a lateral side of the multilayer structure under high pressure by means of a water jet apparatus to make it driven into the multilayer structure like a wedge to peel the multilayer structure and remove the first substrate from the multilayer structure. As a result of the peeling, the epitaxial layer was transferred onto the second substrate.

The porous layer remaining on the epitaxial layer was removed by wet etching and the second substrate was subjected to a hydrogen annealing process to obtain an SOI wafer. Then, a fully depletion type thin film transistor was prepared by using the SOI wafer.

On the other hand, the exposed surface of the separated first substrate was polished to remove the residual porous layer and subjected to hydrogen annealing to obtain a bulk wafer having a flat surface.

The obtained bulk wafer was then used to prepare a CMOS logic circuit. It may be needless to say that the bulk wafer may be sold at a price lower than the ordinary market price of a bulk wafer without using it to prepare a logic circuit.

EXAMPLE 4

P-type monocrystalline Si showing a specific resistance of 0.015 Ω·cm was formed on a first monocrystalline Si substrate to a thickness of 16 µm by epitaxial growth, using a CVD technique and then anodized from the surface of the substrate in an HF solution.

The conditions of the anodization are listed below.

| current density | 7 (mA·$cm^{-2}$) |
|---|---|
| anodizing solution | $HF:H_2O:C_2H_5OH$ = 1:1:1 |
| time | 11 (minutes) |
| thickness of porous Si | 12 (µm) |
| current density | 22 (mA·$cm^{-2}$) |
| anodizing solution | $HF:H_2O:C_2H_5OH$ = 1:1:1 |
| time | 2 (minutes) |
| thickness of porous Si | 3 (µm) |

Of the two porous Si layers, the upper one prepared by anodization, using a low current density, was used to form a high quality epitaxial. Si layer, whereas the lower one prepared by anodization, using a high current density, was used as a separation layer. Therefore, they have their respective functions.

The substrate was then oxidized for an hour in an oxygen atmosphere at 400° C. As a result of oxidation, the inner walls of the pores of the porous Si layers were covered by thermally oxidized film. Then, monocrystalline Si was made to epitaxially grow to a thickness of 0.3 µm by means of CVD. The conditions of the epitaxial growth are listed below.

| source gas | $SiH_2Cl_2/H_2$ |
|---|---|
| gas flow rate | 0.5/180 l/min. |
| gas pressure | 80 Torr |
| temperature | 950° C. |
| growth rate | 0.3 µm/min. |

Then, a 200 nm thick $SiO_2$ layer was formed on the surface of the epitaxial Si layer by thermal oxidation.

Thereafter, a silicon wafer having the same diameter from the surface of which the native oxide film had been removed was brought into contact with the silicon wafer and bonded together by heat treatment to produce a multilayer structure.

Water was blown onto a lateral side of the multilayer structure under high pressure by means of a water jet apparatus to make it driven into the multilayer structure like a wedge to peel the multilayer structure and remove the first substrate from the multilayer structure. As a result of the peeling, the epitaxial layer was transferred onto the second substrate.

The porous layer remaining on the epitaxial layer was removed by wet etching and the second substrate was subjected to a hydrogen annealing process to obtain an SOI wafer. Then, a fully depletion type thin film transistor was prepared by using the SOI wafer.

On the other hand, the exposed surface of the peeled first substrate was polished to remove the residual porous layer and the epitaxial layer that had not been made porous and subjected to hydrogen annealing to externally disperse the residual epitaxial layer and obtain a bulk wafer that performed substantially in the same level as an epitaxial wafer.

The obtained bulk wafer was then used to prepare a CMOS logic circuit.

EXAMPLE 5

A 200 nm thick $SiO_2$ layer was formed on the surface of a first monocrystalline Si substrate by thermal oxidation.

Then, $H^+$ ions were implanted into the first substrate from the surface thereof at a rate of $5 \times 10^{16}$ $cm^{-2}$ by applying a voltage of 40 keV so as to confine the projection range within the Si substrate. As a result, a strained layer was formed at the depth corresponding to the projection range as a microbubble layer or as a layer where the implanted ion seeds showed a high concentration, which then operated as a separation layer.

Thereafter, a silicon wafer having the same diameter from the surface of which the native oxide film had been removed was brought into contact with the silicon wafer and bonded together by heat treatment at 500° C. to produce a multilayer structure, which was then separated into the first substrate and the second substrate.

As a result of the split, the epitaxial layer was transferred onto the second substrate.

The residual separation layer on the surface of the monocrystalline semiconductor layer transferred onto the second substrate was removed by hydrogen annealing and the surface was smoothed to produce an SOI wafer. Then, a fully depletion type thin film transistor was prepared by using the SOI wafer.

On the other hand, the exposed surface of the separated first substrate was found to be carrying part of the separation layer, which was then removed by hydrogen annealing. Then, the surface was smoothed to produce a bulk wafer. Subsequently, a low concentration p-type epitaxial layer was formed thereon to obtain an epitaxial wafer.

EXAMPLE 6

Monocrystalline Si was made to epitaxially grow on a first monocrystalline Si substrate to a thickness of 1 $\mu$m by means of CVD. The conditions of the epitaxial growth are listed below.

| source gas | $SiH_2Cl_2/H_2$ |
|---|---|
| gas flow rate | 0.5/180 l/min. |
| gas pressure | 80 Torr |
| temperature | 950° C. |
| growth rate | 0.30 $\mu$m/min. |

Then, a 200 nm thick $SiO_2$ layer was formed on the surface of the epitaxial Si layer by thermal oxidation.

Then, $H^+$ ions were implanted into the first substrate from the surface thereof at a rate of $5\times10^{16}$ cm$^{-2}$ by applying a voltage of 40 keV so as to confine the projection range within the Si substrate. As a result, a strained layer was formed at the depth corresponding to the projection range as a microbubble layer or as a layer where the implanted ion seeds showed a high concentration, which then operated as a separation layer.

Subsequently, a silicon wafer (second substrate) having the same diameter and carrying an oxide film formed on the surface thereof was treated by nitrogen plasma at the surface to be bonded thereof and then the first and second substrate were brought to contact each other and bonded together to produce a multilayer structure. A water jet was blown onto a lateral side of the multilayer structure and driven toward the center of the multilayer structure to separate it into the first and second substrates.

As a result of the split, the epitaxial layer was transferred onto the second substrate.

The residual separation layer on the surface of the epitaxial layer transferred onto the second substrate was removed by hydrogen annealing and the surface was smoothed to produce an SOI wafer. Then, a fully depletion type thin film transistor was prepared by using the SOI wafer.

On the other hand, the exposed surface of the separated first substrate was found to be carrying the epitaxial layer and part of the separation layer thereon, which was then removed by hydrogen annealing. Then, the surface was smoothed to obtain a bulk wafer. The bulk wafer had a surface layer produced by hydrogen annealing the epitaxial layer and hence performed substantially in the same level as an epitaxial wafer.

The obtained bulk wafer was then used to prepare a CMOS logic circuit.

EXAMPLE 7

A 100 nm thick $SiO_2$ layer was formed on the surface of a first monocrystalline substrate by thermal oxidation.

Then, $H^+$ ions were implanted into the first substrate from the surface thereof at a rate of $5\times10^{16}$ cm$^{-2}$ by applying a voltage of 30 keV so as to confine the projection range within the Si substrate. As a result, a strained layer was formed at the depth corresponding to the projection range as a microbubble layer or as a layer where the implanted ion seeds showed a high concentration, which then operated as a separation layer.

After removing the surface oxide film, amorphous Si or polycrystalline Si was made to grow on the surface of the monocrystalline Si to a thickness of 0.30 $\mu$m by means of CVD. The conditions of the growth are listed below.

| gas seeds | $SiH_4$ |
|---|---|
| gas pressure | 760 Torr |
| temperature | 400° C. |

Thereafter, a 200 nm thick $SiO_2$ layer was formed on the surface.

Then, a silicon wafer having the same diameter from the surface of which the native oxide film had been removed was brought into contact with the silicon wafer and bonded together by heat treatment at 600° C. to produce a multilayer structure, which was subsequently separated into the first and second substrates.

As a result of the split, the monocrystalline semiconductor layer formed by epitaxial growth was transferred onto the second substrate. The residual separation layer on the surface of the monocrystalline semiconductor layer transferred onto the second substrate was removed by hydrogen annealing and the surface was smoothed to produce an SOI wafer. Then, a fully depletion type thin film transistor was prepared by using the SOI wafer.

On the other hand, the exposed surface of the separated first substrate was found to be carrying part of the separation layer, which was then removed by hydrogen annealing. Then, the surface was smoothed to obtain a bulk wafer. For the purpose of the invention, the residue may be removed entirely or partly prior to the hydrogen annealing by polishing or etching.

The obtained bulk wafer was then used to prepare a CMOS logic circuit.

EXAMPLE 8

A first p-type monocrystalline Si substrate showing a specific resistance between 0.01 and 0.02 $\Omega$·cm was anodized in an HF solution.

The conditions of the anodization are listed below.

| current density | 7 (mA · cm$^{-2}$) |
|---|---|
| anodizing solution | $HF:H_2O:C_2H_5OH = 1:1:1$ |
| time | 11 (minutes) |
| thickness of porous Si | 12 ($\mu$m) |

The substrate was then oxidized for an hour in an oxygen atmosphere at 400° C. As a result of oxidation, the inner walls of the pores of the porous Si layer were covered by thermally oxidized film.

Then, ions were implanted into the first substrate from the surface thereof so as to confine the projection range within the porous Si layer (or to the porous Si/substrate interface). As a result, a strained layer was formed at the depth corresponding to the projection range as a microbubble layer or as a layer where the implanted ion seeds showed a high concentration, which then operated as a separation layer.

Then, monocrystalline Si was made to epitaxially grow to a thickness of 0.3 μm on the porous Si layer by means of CVD. The conditions of the epitaxial growth are listed below. Note that the above described hydrogen baking process, the process of supplying a small amount of raw material and the high temperature baking process may be conducted prior to the process of growing monocrystalline Si.

| | |
|---|---|
| source gas | $SiH_2Cl_2/H_2$ |
| gas flow rate | 0.5/180 l/min. |
| gas pressure | 80 Torr |
| temperature | 950° C. |
| growth rate | 0.3 μm/min. |

Then, a 200 nm thick $SiO_2$ layer was formed on the surface of the epitaxial Si layer by thermal oxidation. Thereafter, a silicon wafer having the same diameter from the surface of which the native oxide film had been removed was brought into contact with the silicon wafer and bonded together by heat treatment to produce a multilayer structure.

Water was blown onto a lateral side of the multilayer structure under high pressure by means of a water jet apparatus to make it driven into the multilayer structure like a wedge to peel the multilayer structure and remove the first substrate from the multilayer structure. As a result of the peeling, the epitaxial layer was transferred onto the second substrate.

The porous layer remaining on the epitaxial layer was removed by wet etching and the second substrate was subjected to a hydrogen annealing process to obtain an SOI wafer. Then, a fully depletion type thin film transistor was prepared by using the SOI wafer.

On the other hand, the exposed surface of the peeled first substrate was subjected to an epitaxial growth process to obtain an epitaxial wafer. Note that the residual porous layer may be completely removed before the epitaxial growth process.

The obtained epitaxial wafer was then used to prepare a CMOS logic circuit.

A DRAM and other devices were formed on the epitaxial wafer to prove that it was useful for improving the quality, the yield and the reliability of manufacturing devices.

EXAMPLE 9

A first p-type monocrystalline Si substrate showing a specific resistance of 0.01 Ω·cm was anodized in an HF solution.

The conditions of the anodization are listed below.

| | |
|---|---|
| current density | 7 (mA · cm$^{-2}$) |
| anodizing solution | $HF:H_2O:C_2H_5OH$ = 1:1:1 |
| time | 12 (minutes) |
| thickness of porous Si | 11 (μm) |

The substrate was then oxidized for an hour in an oxygen atmosphere at 400° C. As a result of oxidation, the inner walls of the pores of the porous Si layer were covered by thermally oxidized film. Then, monocrystalline Si was made to epitaxially grow to a thickness of 0.3 μm on the porous Si layer by means of CVD. The conditions of the epitaxial growth are listed below. Note that the above described hydrogen baking process, the process of supplying a small amount of raw material and the high temperature baking process may be conducted prior to the process of growing monocrystalline Si.

| | |
|---|---|
| source gas | $SiH_2Cl_2/H_2$ |
| gas flow rate | 0.5/180 l/min. |
| gas pressure | 80 Torr |
| temperature | 950° C. |
| growth rate | 0.3 μm/min. |

Then, a 200 nm thick $SiO_2$ layer was formed on the surface of the epitaxial Si layer by thermal oxidation.

Then, ions were implanted into the first substrate from the surface thereof so as to confine the projection range to the epitaxial layer/porous Si layer interface (or the porous Si/substrate interface or within the porous Si layer). As a result, a strained layer was formed at the depth corresponding to the projection range as a microbubble layer or as a layer where the implanted ion seeds showed a high concentration, which then operated as a separation layer.

Thereafter, a silicon wafer having the same diameter from the surface of which the native oxide film had been removed was brought into contact with the silicon wafer and bonded together by heat treatment at 1,000° C. to produce a multilayer structure, which was then separated. As a result of the separation, the epitaxial layer was transferred onto the second substrate.

Since practically no porous layer was remaining on the epitaxial layer, the second substrate was subjected to a hydrogen annealing process to obtain an SOI wafer without wet etching. Then, a fully depletion type thin film transistor was prepared by using the SOI wafer.

On the other hand, the exposed surface of the separated first substrate was polished to obtain a bulk wafer.

The obtained bulk wafer was then used to prepare a CMOS logic circuit.

In stead of bonding the second substrate of any of the above examples, polycrystalline silicon may be formed on the uppermost surface of the first substrate to a thickness of 200 to 800 microns by means of a deposition technique such as CVD. Still alternatively, the obtained structure may be split into a plurality of different wafers, which may be used for respective appropriate applications.

EXAMPLE 10

An epitaxial growth layer was formed to a thickness of 1 μm on the surface of a first p-type monocrystalline Si substrate by means of CVD. During this process, the concentration of diborane added as a dopant was regulated to make it a p$^{++}$ Si layer showing a specific resistance of 0.015 Ω·cm. The thickness of the wafer was 6.34 μm.

Then, the epitaxial layer was anodized in a mixture solution of HF and ethanol.

The conditions of the anodization are listed below.

| | |
|---|---|
| current density | 7 (mA · cm$^{-2}$) |
| anodizing solution | $HF:H_2O:C_2H_5OH$ = 1:1:1 |
| time | 12 (minutes) |

It was proved by observing a cross section of a specimen of the anodization product through a high resolution scanning electron microscope that a 10 μm thick porous layer had been formed with a porosity of 20%.

The wafer was then treated at 400° C. for an hour in an oxygen atmosphere and immersed into a 1.25% aqueous solution of HF for 30 seconds to remove the very thin silicon oxide film on the surface. Then, the wafer was put into an epitaxial growth apparatus to produce a 0.3 μm thick monocrystalline Si layer by epitaxial growth, using a CVD (chemical vapor deposition) technique. The conditions of the epitaxial growth are listed below. Note that the above described hydrogen baking process, the process of supplying a small amount of raw material and the high temperature baking process may be conducted prior to the process of growing monocrystalline Si.

| | |
|---|---|
| source gas | $SiH_2Cl_2/H_2$ |
| gas flow rate | 0.2/180 l/min. |
| gas pressure | 760 Torr |
| temperature | 1,060° C. |
| growth rate | 0.15 μm/min. |

Then, a 200 nm thick $SiO_2$ layer was formed on the surface of the epitaxial Si layer by thermal oxidation.

The wafer was then placed on another Si substrate (support substrate) with the surface of the $SiO_2$ layer facing the surface of the support substrate and they were brought into mutual contact. Thereafter, they are annealed at 1,180° C. for 5 minutes to find that they were firmly bonded to each other.

The bonded wafers were forcibly separated along the highly porous layer. Various techniques may be used to separate them apart including application of pressure, application of tensile or shearing force, application of external pressure by means of a wedge, application of ultrasonic waves, application of heat, generating internal pressure within the porous Si layer by causing it to expand through oxidation, application of a pulse of heat to generate thermal stress in the inside and softening. As a matter of fact it was possible to separate them by any of the above listed techniques. Subsequently, the support substrate was immersed into an aqueous solution of a mixture of HF and hydrogen peroxide to find that the residual porous silicon layer was removed from the surface in about 60 minutes to produce an SOI wafer.

Then, the obtained wafer was heat treated at 1,100° C. for 4 hours in a hydrogen atmosphere.

The surface roughness was observed through an atomic force microscope to find that the root means square roughness was 0.2 nm within an area of 50 μm square, which was substantially equal to the root mean square roughness of commercially available Si wafers. The specimen was also observed for the crystal defect density to find that the multilayer defect density was 50 defects/$cm^{-2}$. In other words, a low defect density monocrystalline Si layer was formed on the silicon oxide film layer.

A similar result was obtained when an oxide film was formed not on the surface of the epitaxial layer but on the surface of the second substrate or on the surfaces of both of them.

The residual porous layer on the first substrate was immersed into an aqueous solution of a mixture of HF and hydrogen peroxide to find that it was removed in about 30 minutes. The 1 μm thick epitaxial layer on the first p-type monocrystalline Si substrate was then subjected to hydrogen annealing to reduce the impurity concentration. Then, the substrate was used to prepare a CMOS logic circuit.

A DRAM and other devices were formed on the epitaxial wafer to prove that it was useful for improving the quality, the yield and the reliability of manufacturing devices.

EXAMPLE 11

An epitaxial growth layer was formed to a thickness of 3 μm on the surface of a first p-type monocrystalline Si substrate by means of CVD. During this process, the concentration of diborane added as a dopant was made to vary in order to produce a 2 μm thick upper surface $p^{++}$ Si layer showing a specific resistance of 0.015 Ω·cm and a 1 μm thick lower surface $p^+$ Si layer showing a specific resistance of 0.5 Ω·cm.

During the epitaxial growth, a source gas of $SiH_2Cl_2/H_2$ was supplied at a temperature of 1,110° C. under a pressure of 760 Torr, while letting a dopant of 1% $B_2H_6$ flow at 60 sccm for the $P^{++}$ Si layer and at 0.1 sccm for the $P^+$ Si layer at a growth rate of 3.33 μm/min for the epitaxial layer.

Then, the epitaxial layer was anodized in a mixture solution of HF and ethanol.

The conditions of the anodization are listed below.

| | |
|---|---|
| current density | 7 (mA · $cm^{-2}$) |
| anodizing solution | $HF:H_2O:C_2H_5OH = 1:1:1$ |
| time | 4 (minutes) |

It was proved by observing a cross section of a specimen of the anodization product through a high resolution scanning electron microscope that a low porosity layer of a porosity of 20% and a high porosity layer of a porosity of 50% had been formed respectively in the 2 μm thick upper surface and the 0.5 μm thick lower surface layer of $P^+$ Si layer. The thin high porosity layer was obviously structurally very fragile.

The wafer was then treated at 400° C. for an hour in an oxygen atmosphere and immersed into a 1.25% aqueous solution of HF for 30 seconds to remove the very thin silicon oxide film on the surface. Then, the wafer was put into an epitaxial growth apparatus to produce a 0.3 μm thick monocrystalline Si layer by epitaxial growth, using a CVD (chemical vapor deposition) technique. The conditions of the epitaxial growth are listed below. Note that the above described hydrogen baking process, the process of supplying a small amount of raw material and the high temperature baking process may be conducted prior to the process of growing monocrystalline Si.

| | |
|---|---|
| source gas | $SiH_2Cl_2/H_2$ |
| gas flow rate | 0.2/180 l/min. |
| gas pressure | 760 Torr |
| temperature | 1,060° C. |
| growth rate | 0.15 μm/min. |

Then, a 200 nm thick $SiO_2$ layer was formed on the surface of the epitaxial Si layer by thermal oxidation.

The wafer was then placed on another Si substrate (support substrate) with the surface of the $SiO_2$ layer facing the surface of the support substrate and they were brought into mutual contact. Thereafter, they are annealed at 1,180° C. for 5 minutes to find that they were firmly bonded to each other.

The bonded wafers were forcibly separated along the highly porous layer. Various techniques may be used to separate them apart including application of pressure, application of tensile or shearing force, application of external pressure by means of a wedge, application of ultrasonic waves, application of heat, generating internal pressure within the porous Si layer by causing it to expand through oxidation, application of a pulse of heat to generate thermal stress in the inside and softening. As a matter of fact it was possible to separate them by any of the above listed techniques.

Subsequently, the support substrate was immersed into an aqueous solution of a mixture of HF and hydrogen peroxide to find that the residual porous silicon layer was removed from the surface in about 60 minutes to produce an SOI wafer.

Then, the obtained wafer was heat treated at 1,100° C. for 4 hours in a hydrogen atmosphere. The surface roughness was observed through an atomic force microscope to find that the root means square roughness was 0.2 nm within an area of 50 µm square, which was substantially equal to the root mean square roughness of commercially available Si wafers. The specimen was also observed for the crystal defect density to find that the multilayer defect density was 50 defects/$cm^2$.

In other words, a low defect density monocrystalline Si layer was formed on the silicon oxide film layer.

A similar result was obtained when an oxide film was formed not on the surface of the epitaxial layer but on the surface of the second substrate or on the surfaces of both of them.

The residual porous layer on the first substrate was immersed into an aqueous solution of a mixture of HF and hydrogen peroxide to find that it was removed in about 30 minutes. Then, an epitaxial layer was made to grow with a boron concentration lower than that of the first p-type monocrystalline Si substrate in order to produce an epi-wafer. The epi-wafer was used to prepare a CMOS logic circuit.

A DRAM and other devices were formed on the epitaxial wafer to prove that it was useful for improving the quality, the yield and the reliability of manufacturing devices.

EXAMPLE 12

Monocrystalline Si was made to epitaxially grow on a first monocrystalline Si substrate to a thickness of 1 µm by means of CVD. The conditions of the epitaxial growth are listed below.

| | |
|---|---|
| source gas | $SiH_2Cl_2/H_2$ |
| gas flow rate | 0.5/180 l/min. |
| gas pressure | 80 Torr |
| temperature | 950° C. |
| growth rate | 0.30 µm/min. |

More specifically, the initial 0.5 microns of the height was a $P^-$ layer of 1 Ω·cm formed by using $B_2H_6$ as a dopant, while the upper 0.5 microns of the height was a $N^-$ layer of 1 Ω·cm formed by using $PH_3$ as a dopant.

Then, a 200 nm thick $SiO_2$ layer was formed on the surface of the epitaxial Si layer by thermal oxidation.

Then, $H^+$ ions were implanted into the first substrate from the surface thereof at a rate of $5 \times 10^{16}$ $cm^{-2}$ by applying a voltage of 70 keV so as to confine the projection range within the epitaxial layer. As a result, a strained layer was formed at the depth corresponding to the projection range which was close to the $P^-/N^-$ interface as a microbubble layer or as a layer where the implanted ion seeds showed a high concentration, which then operated as a separation layer.

Subsequently, a silicon wafer (second substrate) having the same diameter was treated by nitrogen plasma at the surface to be bonded thereof and then the first and second substrate were brought to contact each other and bonded together to produce a multilayer structure, which may or may not be heat treated at about 200° C.

A water jet was blown onto a lateral side of the multilayer structure and driven toward the center of the multilayer structure to separate it into the first and second substrates.

The two substrates could also be separated by heat treatment at 500° C. or by utilizing the effect of crystal rearrangement or that of pressure within microbubbles.

As a result, the $N^-$ monocrystalline semiconductor layer was transferred onto the second substrate.

The residual separation layer on the epitaxial layer that had been transferred onto the second substrate was removed by hydrogen annealing and the surface of the epitaxial layer was smoothed to obtain an SOI wafer. A similar SOI wafer could be prepared by touch polishing of the surface in place of hydrogen annealing. Then, the wafer was used to prepare a fully depletion type thin film transistor.

On the other hand, the separated first substrate carried the $P^-$ epitaxial layer and a residue of the separation layer on the surface thereof, which was then removed by hydrogen annealing. Then, the surface of the substrate was smoothed to obtain an epi-wafer. A similar epi-wafer could be prepared by touch polishing of the surface in place of hydrogen annealing. Since the bulk wafer had a layer formed by hydrogen annealing of the epitaxial layer on the surface, it performed like an epitaxial wafer. An epi-wafer that is currently most popular as $P^-$ epitaxial/$P^+$ wafer was obtained by using a $P^+$ substrate for the first Si wafer. The epi-wafer was then used to prepare a CMOS logic circuit.

A DRAM and other devices were formed on the epitaxial wafer to prove that it was useful for improving the quality, the yield and the reliability of manufacturing devices.

EXAMPLE 13

$P^-$ monocrystalline Si was formed to a thickness of 1 µm by epitaxial growth by means of CVD to make it show a specific resistance of about 18 Ω·cm on a first $P^+$ monocrystalline Si substrate showing a specific resistance between 0.01 and 0.02 Ω·cm.

The conditions of the epitaxial growth are listed below.

| | |
|---|---|
| source gas | $SiH_2Cl_2/H_2$ |
| gas flow rate | 0.5/180 l/min. |
| gas pressure | 80 Torr |
| temperature | 950° C. |
| growth rate | 0.30 µm/min. |

Then, a 200 nm thick $SiO_2$ layer was formed on the surface of the epitaxial Si layer by thermal oxidation.

Then, $H^+$ ions were implanted into the first substrate from the surface thereof at a rate of $5 \times 10^{16}$ $cm^2$ by applying a voltage of 40 kevso as to confine the projection range within the epitaxial layer. As a result, a strained layer was formed at the depth corresponding to the projection range as a microbubble layer or as a layer where the implanted ion seeds showed a high concentration, which then operated as a separation layer.

Subsequently, a silicon wafer (second substrate) having the same diameter was treated by nitrogen plasma at the surface to be bonded thereof and then the first and second substrate were brought to contact each other and bonded together to produce a multilayer structure. A water jet was blown onto a lateral side of the multilayer structure and driven toward the center of the multilayer structure to separate it into the first and second substrates. The two substrates could also be separated by heat treatment.

As a result, the monocrystalline semiconductor layer was transferred onto the second substrate.

The residual separation layer on the surface of the epitaxial layer that had been transferred onto the second substrate was removed by hydrogen annealing and the surface of the epitaxial layer was smoothed to obtain an SOI wafer. Then, the SOI wafer was used to prepare a fully depletion type thin film transistor. Thus, a P$^+$ substrate can be used for preparing an SOI wafer by implanting hydrogen ions if an epi-layer is utilized.

On the other hand, the separated first substrate carried the epitaxial layer and a residue of the separation layer on the surface thereof, which was then removed by hydrogen annealing. Then, the surface of the substrate was smoothed to obtain a bulk wafer. Since the bulk wafer had a layer formed by hydrogen annealing of the epitaxial layer on the surface, it performed like an epitaxial wafer.

The epi-wafer was then used to prepare a CMOS logic circuit.

EXAMPLE 14

The surface of a first monocrystalline Si substrate was subjected to an anodization process in an HF solution.

The conditions of the anodization are listed below.

The conditions for preparing a first porous layer to be prepared first and used as the uppermost layer:

| | |
|---|---|
| current density | 1 (mA · cm$^{-2}$) |
| anodizing solution | HF:H$_2$O:C$_2$H$_5$OH = 1:1:1 |
| time | 0.1 (minutes) |
| thickness of porous Si | 0.02 ($\mu$m) |

The conditions for preparing a second porous layer to be prepared next:

| | |
|---|---|
| current density | 50 (mA · cm$^{-2}$) |
| anodizing solution | HF:H$_2$O:C$_2$H$_5$OH = 1:1:1 |
| time | 5 (seconds) |
| thickness of porous Si | 0.1 ($\mu$m) |

The conditions for preparing a third porous layer to be prepared last:

| | |
|---|---|
| current density | 7 (mA · cm$^{-2}$) |
| anodizing solution | HF:H$_2$O:C$_2$H$_5$OH = 1:1:1 |
| time | 1 (minutes) |
| thickness of porous Si | 1 ($\mu$m) |

As a result of the anodization, the second porous layer that was thicker than the first porous layer and prepared with a current density of 50 (mA·cm$^{-2}$) showed the highest porosity of all the porous Si layers and hence was structurally most fragile.

The substrate was then oxidized for an hour in an oxygen atmosphere at 400° C. As a result of oxidation, the inner walls of the pores of the porous Si layer were covered by thermally oxidized film. The wafer was placed in an epitaxial growth apparatus filled with a hydrogen atmosphere and baked at 1,040° C. for 5 minutes. As a result of the heat treatment (baking), the surface pores of the uppermost porous Si layer were filled. Then, the uppermost surface layer that was the first porous Si layer prepared with a current density of 1 (mA·cm$^{-2}$) was transformed into a non-porous layer through migration of Si atoms.

Subsequently, monocrystalline Si was made to epitaxially grow on the porous Si having a non-porous surface to a thickness of 0.3 $\mu$m by means of CVD (chemical vapor deposition). The conditions of the epitaxial growth are listed below.

| | |
|---|---|
| source gas | SiH$_2$Cl$_2$/H$_2$ |
| gas flow rate | 0.5/180 l/min. |
| gas pressure | 80 Torr |
| temperature | 950° C. |
| growth rate | 0.30 $\mu$m/min. |

Then, a 200 nm thick SiO$_2$ layer was formed on the surface of the epitaxial Si layer by thermal oxidation.

Subsequently, another silicon substrate (second substrate) was brought in and then the first and second substrate were brought to contact each other and heat-treated at 1,180° C. for 5 minutes to find that they were firmly bonded together.

Then, external force was applied to the bonded substrates. As a result, the second porous layer showing the highest porosity was destroyed and the two substrates were separated along the interface of the non-porous layer and the adjacent porous layer.

Thus, a 0.2 $\mu$m thick monocrystalline Si layer was formed on the Si oxide film of the second substrate to produce an SOI substrate. No porous Si was found remaining on the surface of the monocrystalline Si layer (separation layer). By separating the two substrates along the interface of the non-porous layer and the adjacent porous layer, it is now possible to omit various steps that are normally required to obtain an SOI layer having a smooth surface.

More specifically, the two substrates could be separated apart along the interface because stress can be intensively generated at and near the interface. This technique of intensively generating stress along an interface can also be used for a hetero-epitaxial film such as SiGe on silicon.

The porous Si remaining on the first substrate was selectively etched out by immersing it into an aqueous solution of a mixture of 49% hydrofluoric acid and 30% hydrogen peroxide to produce a bulk wafer having a smooth surface. It was used as a device forming wafer or a monitor wafer without being used as first or second substrate as described above.

As discussed above in detail, the present invention provides a method of manufacturing high quality semiconductor wafers on a mass production basis with an enhanced degree of reproducibility. A method of manufacturing semiconductor wafers according to the invention can provide high quality SOI wafers that can be efficiently used and reused without affecting the supply of wafers to the market.

What is claimed is:

1. A process for manufacturing a semiconductor wafer, comprising the steps of:

preparing a first member which has a semiconductor layer on a p-type semiconductor substrate, the surface of said p-type semiconductor substrate opposite to said semiconductor layer being covered with a back shield;

separating said semiconductor layer from said first member to transfer the semiconductor layer onto a second member, thereby forming a first semiconductor wafer; and conducting epitaxial growth of a low concentration p-type semiconductor layer on the surface, on which said semiconductor layer had been provided, of said p-type semiconductor substrate having the back shield, said low concentration p-type semiconductor layer having an impurity concentration, which defines p-type conductivity, lower than that of said p-type semiconductor substrate.

2. A process for manufacturing a semiconductor wafer, comprising the steps of:

preparing a first member which has a semiconductor layer on a p-type semiconductor substrate with a separation layer arranged therebetween, the surface of said p-type semiconductor substrate opposite to said semiconductor layer being covered with a back shield;

separating said first member at said separation layer; and conducting epitaxial growth of a low concentration p-type semiconductor layer on the surface, on which said semiconductor layer had been provided, of said p-type semiconductor substrate having the back shield, said low concentration p-type semiconductor layer having an impurity concentration, which defines p-type conductivity, lower than that of said p-type semiconductor substrate.

3. A process for manufacturing a semiconductor wafer, comprising the steps of:

forming a separation layer within a p-type semiconductor substrate to form a first member which has a semiconductor layer on said separation layer, the surface of said p-type semiconductor substrate opposite to said semiconductor layer being covered with a back shield;

separating said semiconductor layer through said separation layer to transfer the semiconductor layer onto a second member, thereby forming a first semiconductor wafer; and conducting epitaxial growth of a low concentration p-type semiconductor layer on the surface on which the semiconductor layer had been provided, of said p-type semiconductor substrate having the back shield, said low concentration p-type semiconductor layer having an impurity concentration, which defines p-type conductivity, lower than that of said p-type semiconductor substrate.

4. The process for manufacturing a semiconductor wafer according to claim 1, wherein the back shield is formed by a process comprising the steps of:

bonding said first member with a second member to form a multilayer structure; and conducting heat-treatment of said multilayer structure under an oxidizing atmosphere.

5. A process for manufacturing a semiconductor wafer, comprising the steps of:

preparing a first member which has at least a first semiconductor layer comprising an epitaxial semiconductor layer having an impurity concentration, which defines p-type conductivity, lower than that of a p-type semiconductor substrate, a separation layer, and a second semiconductor layer, arranged on said p-type semiconductor substrate in the order as mentioned;

forming a first semiconductor wafer via transferring said second semiconductor layer onto a second member through the separation step of separating said second semiconductor layer at said separation layer; and forming a second semiconductor wafer having said first semiconductor layer on said p-type semiconductor substrate by hydrogen annealing the first semiconductor layer remaining on said p-type semiconductor substrate.

6. A process for manufacturing a semiconductor wafer, comprising the steps of:

forming at least a first semiconductor layer comprising an epitaxial semiconductor layer having an impurity concentration, which defines p-type conductivity, lower than that of a p-type semiconductor substrate, and a second semiconductor layer comprising an epitaxial semiconductor layer having an impurity concentration, which defines p-type conductivity, higher than that of said first semiconductor layer, arranged on said p-type semiconductor substrate in the order as mentioned, making said second semiconductor layer and part of said first semiconductor layer porous, and forming a third semiconductor layer onto said second semiconductor layer made porous, thereby forming a first member;

transferring said third semiconductor layer onto said second member to form a first semiconductor wafer; and forming a second semiconductor wafer comprising said p-type semiconductor substrate having said first semiconductor layer by hydrogen annealing said first semiconductor layer remaining on said p-type semiconductor substrate.

7. A process for manufacturing a semiconductor wafer, comprising the steps of:

preparing a semiconductor member which has a semiconductor layer on a p-type semiconductor substrate with a separation layer arranged therebetween, the back surface of said p-type semiconductor substrate opposite to said separation layer and the surface of said semiconductor layer each being covered with an oxide film;

separating said semiconductor member at said separation layer; and conducting epitaxial growth of a low concentration p-type semiconductor layer on the surface, on which said separation layer had been provided, of said p-type semiconductor substrate having said oxide film on the back side thereof, said low concentration p-type semiconductor layer having an impurity concentration, which defines p-type conductivity, lower than that of said p-type semiconductor substrate.

8. The process for manufacturing a semiconductor wafer according to claim 2, wherein the back shield is formed by a process comprising the steps of:

bonding said first member with a second member to form a multilayer structure; and conducting heat-treatment of said multilayer structure under an oxidizing atmosphere.

9. A process for manufacturing a wafer as defined in any one of claims 2, 3, 4, 5 and 8, wherein said separation layer is selected from the group consisting of a porous layer and a microbubble layer.

10. A process for manufacturing a semiconductor wafer as defined in claim 9, wherein said separation layer is formed by ion implantation using a gas selected from the group consisting of hydrogen, nitrogen, and rare gas.

11. A process for manufacturing a semiconductor wafer as defined in claim 10, wherein said ion implantation is plasma immersion ion implantation.

12. A process for manufacturing a semiconductor wafer as defined in any one of claims 1 to 6 and 8, wherein said first semiconductor wafer and said second semiconductor wafer are used to manufacture any one of a semiconductor device and a solar battery.

13. A process for manufacturing a semiconductor wafer as defined in any one of claims 1 to 6 and 8, wherein the step of forming said first semiconductor wafer comprises the steps of bonding said first member with said second member so as to arrange said semiconductor layer inside to form a multilayer structure and separating said multilayer structure.

14. A process for manufacturing a semiconductor wafer as defined in claim 13, wherein said bonding step is conducted through an insulating layer.

15. A process for manufacturing a semiconductor wafer as defined in claim 13, wherein said bonding step is conducted after forming an insulating layer on the surface of said semiconductor layer.

16. A process for manufacturing a semiconductor wafer as defined in any one of claims 1 to 4 and 8, wherein the specific resistance of said low concentration p-type silicon layer is between 0.02 $\Omega \cdot cm$ to 10000 $\Omega \cdot cm$.

17. A process for manufacturing a semiconductor wafer as defined in any one of claims 1 to 4 and 8, wherein said low concentration p-type silicon layer is an epitaxial silicon layer in which the concentration of boron is $1 \times 10^{17}$ $cm^{-3}$.

18. A process for manufacturing a semiconductor wafer as defined in any one of claims 1 to 6 and 8, wherein at least one inspection step selected from the group consisting of inspection of the density of surface foreign particles, inspection of film thickness distribution, inspection of the density of defects, inspection of surface profile, and inspection of edges is conducted on said second semiconductor wafer.

19. A process for manufacturing a semiconductor wafer as defined in claim 4, wherein said p-type semiconductor substrate is a high concentration p-type silicon wafer.

20. A process for manufacturing a semiconductor wafer as defined in claim 19, wherein the concentration of boron in said high concentration p-type silicon wafer is between $1 \times 10^{17}$ $cm^{-3}$ and $1 \times 10^{20}$ $cm^{-3}$.

21. A process for manufacturing a semiconductor wafer as defined in claim 19, wherein the specific resistance of said high concentration p-type silicon wafer is between 0.001 $\Omega \cdot cm$ to 0.5 $\Omega \cdot cm$.

22. A process for manufacturing a semiconductor wafer as defined in claim 5 or claim 6, wherein said first semiconductor layer is a $P^-$-epitaxial silicon layer.

23. A process for manufacturing a semiconductor wafer as defined in claim 5 or claim 6, wherein said first semiconductor layer is composed of a plurality of layers.

24. A process for manufacturing a semiconductor wafer as defined in claim 5, wherein said second semiconductor layer has an impurity concentration, which defines p-type conductivity, higher than that of said first semiconductor layer.

25. A process for manufacturing a semiconductor wafer as defined in claim 5, wherein the impurity concentration, which defines p-type conductivity, of said first semiconductor layer is identical with that of said second semiconductor layer.

26. A process for manufacturing a semiconductor wafer as defined in claim 5, wherein said second semiconductor layer and separation layer are formed by ion implantation using a gas selected from the group consisting of hydrogen, nitrogen, and rare gas.

27. A process for manufacturing a semiconductor wafer as defined in claim 5 or claim 6, wherein said second semiconductor wafer is formed by smoothing the surface of said first semiconductor layer on said separated p-type semiconductor substrate.

28. A process for manufacturing a semiconductor wafer as defined in claim 27, wherein said smoothing step is carried out by conducting at least one treatment selected from the group consisting of surface-polishing, planing, etching, and heat-treatment.

29. A process for manufacturing a semiconductor wafer as defined in claim 28, wherein said heat-treatment is heat-treatment under a reducing atmosphere containing hydrogen.

30. A process or manufacturing a semiconductor wafer as defined in claim 29, wherein a temperature for said heat-treatment under a reducing atmosphere containing hydrogen is not lower than 800° C. and not higher than the melting temperature of the component materials of said p-type semiconductor substrate.

31. A process for manufacturing a semiconductor wafer as defined in claim 5, comprising the additional step of transferring said second semiconductor layer to said second semiconductor substrate followed by removing said separation layer remaining on said second semiconductor layer.

32. A process for manufacturing a semiconductor wafer as defined in claim 6, comprising the additional step of transferring said third semiconductor layer to said second semiconductor substrate followed by removing said separation layer remaining on said second semiconductor layer.

33. A process for manufacturing a semiconductor wafer as defined in claim 31 or claim 32, wherein heat-treatment under a reducing atmosphere containing hydrogen is conducted after removing said remaining separation layer.

34. A process for manufacturing a semiconductor wafer as defined in any one of claims 2, 3, 4, and 5, wherein said separation through said separation layer is separation caused at a part selected from the group consisting of the inside, the upper surface, and the lower surface of said separation layer.

35. A process for manufacturing a semiconductor wafer as defined in claim 6, wherein said step of transferring said third semiconductor layer onto said second member is carried out by conducting separation at a part selected from the group consisting of the inside, the upper surface, and the lower surface of said first semiconductor layer made porous.

36. A process for manufacturing a semiconductor wafer as defined in any one of claims 1 to 6 and 8, wherein said second semiconductor wafer is used for use other than that for said first and second members.

37. A process for manufacturing a semiconductor wafer as defined in any one of claims 4 and 8, wherein an oxide film having a thickness of 10 nm to 10 $\mu m$ is formed on the back side of said p-type silicon substrate by said heat-treatment under an oxidizing atmosphere.

* * * * *

UNITED STATES PATENT AND TRADEMARK OFFICE
CERTIFICATE OF CORRECTION

PATENT NO.    : 6,656,271 B2
DATED         : December 2, 2003
INVENTOR(S)   : Takao Yonehara et al.

It is certified that error appears in the above-identified patent and that said Letters Patent is hereby corrected as shown below:

Title page,
Item [57], ABSTRACT, should read as follows:
-- A process of manufacturing a semiconductor wafer includes preparing a first member which has a semiconductor layer on a p-type semiconductor substrate, the surface of the substrate opposite to the semiconductor layer being covered with a back shield, separating the semiconductor layer from the first member to transfer the semiconductor layer onto a second member, thereby forming a semiconductor wafer, and conducting epitaxial growth of a low concentration p-type semiconductor layer on the surface, on which the semiconductor layer had be enprovided, of the p-type semiconductor substrate having the back shield, the low concentration p-type semiconductor layer having an impurity concentration, which defines p-type conductivity, lower than that of the p-type semiconductor substrate. --.

Column 1,
Line 57, "Firstly," should read -- First, --.
Line 58, "as" should read -- as a --.

Column 2,
Line 9, "shows" should read -- show --.
Line 13, "as" should read -- as a --.
Line 18, "SOI" should read -- SOI wafer --.
Line 31, "above described" should read -- above described --.
Line 32, "dissolved." should read -- overcome. --.

Column 3,
Line 4, "suitability" should read -- stability --.
Line 65, "having" should read -- having an --.

Column 4,
Line 14, "having" should read -- having a low --.
Line 26, "atmosphere" should read -- atmosphere; --.
Lines 35, 43 and 62, "having" should read -- having an --.
Line 58, "an-epitaxial" should read -- an epitaxial- -- and "having" should read -- having an --.
Line 60, "substrate;" should read -- substrate, --.
Line 64, "layer;" should read -- layer, --.
Line 65, "mentioned;" should read -- mentioned, --.

Column 5,
Line 2, "porous;" should read -- porous, --.

UNITED STATES PATENT AND TRADEMARK OFFICE
CERTIFICATE OF CORRECTION

PATENT NO. : 6,656,271 B2
DATED : December 2, 2003
INVENTOR(S) : Takao Yonehara et al.

It is certified that error appears in the above-identified patent and that said Letters Patent is hereby corrected as shown below:

Column 6,
Line 4, " am" should read -- a --.
Line 28, "called" should read -- called a --.
Line 31, "water." should read -- wafer. --.
Line 63, "as the" should read -- as that of the --.

Column 7,
Line 4, "as" should read -- as a --.
Line 5, "Like can" should read -- like, can --.
Line 10, "structure," should read -- structure, by --.
Line 22, "by" should read -- by a
Line 23, "of" should read -- of an --.
Line 38, "destroying" should read -- destroying the attachment --.
Line 45, "water;" should read -- water, --.
Line 46, "nitric acid;" should read -- nitric acid, --.
Line 47, "hydroxide;" should read -- hydroxide, -- and "having" should read -- having a --.
Line 50, "etching" should read -- performing etching --.
Line 52, "its" should read -- a --.
Line 53, "metal" should read -- metals --.
Line 58, "above mentioned" should read -- above-mentioned --.

Column 8,
Line 28, "pressure, it" should read -- pressure. It --.
Line 42, "as" should read -- as an --.
Line 57, "granule" should read -- granules --.
Line 58, "and" should read -- and an --.
Line 60, "or alkali" should read -- or an alkali --.

Column 9,
Line 25, "having" should read -- having a --.
Line 29, "$^{P-(}$or N-)" should read -- P-type (or an N-type) --.
Line 30, "type" should be deleted.
Line 38, "a" should read -- an --.
Line 42, "(T" should read -- (T. --.
Line 60, "by" should read -- by a --
Line 62, "should" should read -- and should --.

UNITED STATES PATENT AND TRADEMARK OFFICE
CERTIFICATE OF CORRECTION

PATENT NO. : 6,656,271 B2
DATED : December 2, 2003
INVENTOR(S) : Takao Yonehara et al.

It is certified that error appears in the above-identified patent and that said Letters Patent is hereby corrected as shown below:

Column 10,
Line 5, "analogous" should read -- analog -- and "SIH$_4$," should read -- SiH$_4$, --.
Line 14, "Pa" should read -- P$^+$ --.
Line 19, "memory, logic circuit, analog" should read -- a memory, a logic circuit, an analog -- .
Line 20, "analog-digital" should read -- an analog-digital --.
Line 21, "CCD," should read -- CCDs, --.
Line 28, "reducing a" should read -- reducing --.
Line 34, "epitaxial/P*" should read -- epitaxial/P$^+$ --.
Line 55, "p$^+$" should read -- P$^+$ --.
Line 64, "above mentioned" should read -- above-mentioned --.
Line 65, "When" should read -- When a --.
Line 66, "above mentioned" should read -- above-mentioned --.

Column 11,
Line 3, "such" should read -- such an -- and "or" should read -- or a --.
Line 22, "a nodization" should read -- anodization --.
Line 35, "layer 4" should read -- layer 5 --.
Line 64, "designate" should read -- designates --.

Column 12,
Line 48, "remains," should read -- remains, and -- and "above remaining" should read -- above-remaining --.
Line 52, "wafer, the" should read -- wafer, --.
Line 53, "wafer" should read -- and it -- and "it porous." should read -- the wafer porous. --.
Line 64, "an oxide film or" should read -- as an oxide film or a --.
Line 65, "prevent" should read -- prevent the --.

Column 13,
Line 17, "nm,/min." should read -- nm/min. --.
Line 23, "atmosphere," should read -- atmosphere. --

Column 14,
Line 10, "peeled-first" should read -- peeled first --.
Line 27, "on" should read -- of --.

UNITED STATES PATENT AND TRADEMARK OFFICE
CERTIFICATE OF CORRECTION

PATENT NO. : 6,656,271 B2
DATED : December 2, 2003
INVENTOR(S) : Takao Yonehara et al.

It is certified that error appears in the above-identified patent and that said Letters Patent is hereby corrected as shown below:

Column 16,
Line 13, "wafer" should read -- wafers --.
Line 31, "(FIG. 15F)," should read -- (FIG. 15F), and --.
Line 33, "obtain a" should read -- obtain an --.
Line 42, "such" should read -- such a --.

Column 17,
Line 10, "as" should read -- as an --.
Line 18, "at-the" should read -- at the --.
Line 56, "and" should read -- and a --.

Column 18,
Line 12, "of" should read -- of a --.
Line 15, "implanted-into" should read -- implanted into --.
Line 19, "insulating-layer 6" should read -- insulating layer 6 --.

Column 19,
Line 8, "out-on" should read -- out on --.
Line 29, "or" should read -- or a --.
Line 42, "above men-" should read -- above-men- --.
Line 46, "reeled," should read -- peeled, --.
Line 51, "above mentioned" should read -- above-mentioned --.
Line 52, "employ always" should read -- always employ --.

Column 20,
Line 10, "is" should read -- are --.
Line 28, "such" should read -- such an --.
Line 29, "porous," should read -- porous, in --.
Line 43, "having" should read -- having a --.
Line 45, "the" should be deleted.
Line 46, "above mentioned" should read -- above-mentioned
Line 50, "are" should read -- is --.
Line 57, "such" should read -- such a --.
Line 64, "than" should read -- than in --.

Column 21,
Line 6, "A two" should read -- Two --.
Line 11, "such" should read -- such a --.
Line 13, "when" should read -- when a --.
Line 27, "embodiment" should read -- embodiment, --.
Line 43, "comes" should read -- come --.
Line 54, "a" should read -- the --.

UNITED STATES PATENT AND TRADEMARK OFFICE
CERTIFICATE OF CORRECTION

PATENT NO. : 6,656,271 B2
DATED : December 2, 2003
INVENTOR(S) : Takao Yonehara et al.

It is certified that error appears in the above-identified patent and that said Letters Patent is hereby corrected as shown below:

Column 22,
Line 4, "When" should read -- When the --.
Line 7, "carried" should read -- carried out--.
Line 8, "value" should read -- value- --.
Line 16, "than" should read -- than a --.
Line 51, "thereof" should read -- thereof. --
Line 52, "portion." should read -- portion --.
Line 63, "P⁻" should read -- P-type --.

Column 23,
Line 36, "or-N" should read -- or N --.
Line 42, "as" should read -- as an --.
Line 46, "oxidized" should read -- oxidized, --.
Line 56, "separation" should read -- separation layer --.

Column 24,
Line 7, "surface" should read -- surfaces --.
Line 9, "the" should read -- these --.
Line 14 "out. While" should read -- out while --.
Line 16, "surface" should read -- surfaces --.
Line 17, "to-apply" should read -- to apply --.
Line 40, "hydrogen-" should read -- hydrogen --.
Line 66, "numerals," should read -- numerals, and -- and "there of" should read -- thereof --.

Column 25,
Line 27, "teat" should read -- heat --.
Line 42, "disuse" should read -- eliminate use of --.
Line 45 "These" should read -- The --.
Line 49, "groups-of should read -- group of --.
Line 57, "for" should read -- for the --.
Line 59, "another" should read -- other --.

Column 26,
Lines 8 and 9, "a" should be deleted.
Line 32, "for" should read -- for an --.
Line 33, "wafer, a" should read -- wafer, an --.
Line 52, "for" should read -- to --.
Line 55, "system of the" should read -- embodiment in --.
Line 67, "layer." should read -- layer). --.

UNITED STATES PATENT AND TRADEMARK OFFICE
CERTIFICATE OF CORRECTION

PATENT NO. : 6,656,271 B2
DATED : December 2, 2003
INVENTOR(S) : Takao Yonehara et al.

It is certified that error appears in the above-identified patent and that said Letters Patent is hereby corrected as shown below:

Column 28,
Line 35, "as" should read -- as a --.
Line 36, "Ag" should read -- Ag film --.

Column 29,
Line 6, "go" should be deleted.

Column 30,
Line 14, "as" should read -- as a --.
Line 17 "order" should read -- order to --.
Line 20, "epitaxial-layer" should read -- epitaxial layer -- and "on-the" should read -- on the --.
Line 55, "$HF:H_2O:C_2H_{50H=1:1:1}$" should read -- $HF:H_2O:C_2H_5OH=1:1:1$ --

Column 31,
Line 67, "epitaxial." should read -- epitaxial --.

Column 33,
Line 30, "40 keVso" should read -- 40 keV so --.
Line 39, "substrate" should read -- substrates --.
Line 40, "to contact" should read -- into contact with --.

Column 36,
Line 41, "In stead" should read -- Instead --.

Column 37,
Line 37, "application" should read -- or application --.
Line 38, "fact" should read -- fact, --.
Line 48, "means" should read -- mean --.

Column 39,
Line 7, "fact" should read -- fact, --.
Line 18, "means" should read -- mean --.
Line 58, "was a" should read -- was an --.

UNITED STATES PATENT AND TRADEMARK OFFICE
CERTIFICATE OF CORRECTION

PATENT NO. : 6,656,271 B2
DATED : December 2, 2003
INVENTOR(S) : Takao Yonehara et al.

It is certified that error appears in the above-identified patent and that said Letters Patent is hereby corrected as shown below:

Column 40,
Line 8, "substrate" should read -- substrates -- and "to contact" should read -- into contact with --.
Line 35, "as" should read -- as a --.
Line 61, " $5x10^{16}cm^2$ " should read -- $5 \times 10^{16} cm^{-2}$ --.
Line 62, "40 kevso" should read -- 40 keV so --.

Column 41,
Line 4, "substrate" should read -- substrates -- and "to contact" should read -- into contact with --.

Column 42,
Line 27, "substrate" should read -- substrates --.
Line 28, "to contact" should read -- into contact with --.
Line 54, "as" should read -- as a --.

Column 46,
Line 21, "or" should read -- for --.

Signed and Sealed this

Tenth Day of August, 2004

JON W. DUDAS
*Acting Director of the United States Patent and Trademark Office*